US005563902A

United States Patent [19]
Xu et al.

[11] Patent Number: 5,563,902
[45] Date of Patent: Oct. 8, 1996

[54] SEMICONDUCTOR RIDGE WAVEGUIDE LASER WITH LATERAL CURRENT INJECTION

[75] Inventors: Jingming Xu, Oakville, Canada; Michael Shur; Boris Gelmont, both of Charlottesville, Va.

[73] Assignee: Samsung Electronics, Co. Ltd., Seoul, Rep. of Korea

[21] Appl. No.: 425,670

[22] Filed: Apr. 18, 1995

Related U.S. Application Data

[63] Continuation of Ser. No. 294,511, Aug. 23, 1994, abandoned.

[51] Int. Cl.$^6$ .............................. H01S 3/19; H01S 3/10
[52] U.S. Cl. .............................. 372/50; 372/46; 372/47; 372/96
[58] Field of Search .............................. 372/46, 47, 45, 372/50, 96

[56] References Cited

U.S. PATENT DOCUMENTS

| | | | |
|---|---|---|---|
| 4,700,353 | 10/1987 | Van Gieson et al. | 372/47 |
| 4,805,179 | 2/1989 | Harder et al. | 372/47 |
| 5,164,797 | 11/1992 | Thornton | 372/47 |
| 5,181,085 | 1/1993 | Moon et al. | 372/50 X |
| 5,202,896 | 4/1993 | Taylor | 372/50 |
| 5,301,202 | 4/1994 | Harder et al. | 372/46 |
| 5,357,538 | 10/1994 | Talneau et al. | 372/46 |

OTHER PUBLICATIONS

Boris Gelmont and Michael Shur, Low–Threshold Laser Utilizing Junction Between Two–Dimensional Electron Gas and P–Type Semiconductor, 1991 International Semiconductor Device Research Symposium, Dec. 4–6, 1991, pp. 193–196.
Eugene Hecht, Optics, Chapter 14, Sundry Topics from Contemporary Optics, ©1987, pp. 578–593, Apr. 1988.
Ken Werner, Higher Visibility for LEDs, IEEE Spectrum, Jul. 1994, pp. 30–34.
C. Harder, P. Buchmann, and H. Meier, High–Power Ridge––Waveguide AlGaAs Grin–Sch Laser Diode, Electronics Letters, 25th Sep. 1986, vol. 22, No. 20.
Gen–Lin Tan, J. M. Xu, and Michael Shur, GaAs/AlGaAS Double–Heterojunction Lateral p–i–n Ridge Waveguide Laser, Optical Engineering, Sep. 1993, vol. 32, No. 9, pp. 2042–2045.
Y. J. Yang, Y. C. Lo, G. S. Lee, K. Y. Hsieh, and R. M. Kolbas, Traverse Junction Strips Laser With A Lateral Heterobarrier By Diffusion Enhanced Alloy Disordering, Aug. 4, 1986, pp. 835–837.
H. Namizaki, H. Kan, M. Ishii, and A. Ito, Transverse–Junction–Stripe–Geometry Double–Heterostructure Lasers With Very Low Threshold Current, Feb. 20, 1974, pp. 2785–2786.
Gen–Lin Tan, Naveen Bewtra, Keith Lee, and J. M. Xu, A Two–Dimensional Nonisothermal Finite Element Simulation of Laser Diodes; IEEE Journal of Quantum Electronics, vol. 29, No. 3, Mar., 1993, pp. 822–835.
Yongkun Sin, K. Y. Hsieh, J. H. Lee, and R. M. Kolbas, Surface And Bulk Leakage Currents In Transverse Junction Stripe Lasers, J. Appl. Phys. 69(2), Jan. 15, 1991, pp. 1081–1090.
T. Ohtoshi, K. Yamaguchi, C. Nagaoka, T. Uda, Y. Murayama, and N. Chinone, A Two–Dimensional Device Simulator of Semiconductor Lasers, Solid–State Electronics, vol. 30, No. 6, ©1987, pp. 627–638 (no month).

(List continued on next page.)

*Primary Examiner*—James W. Davie
*Attorney, Agent, or Firm*—Skjerven, Morrill, MacPherson, Franklin & Friel

[57] ABSTRACT

A semiconductor laser device is provided in which an active layer is sandwiched between and upper and lower cladding layer, the lower cladding layer being situated on a semi-insulating substrate. The upper cladding layer includes a raised ridge section running from end to end between the facets or end surfaces of the laser cavity. The ridge section aids in optical confinement. A p+ contact region and an n+ contact region are formed extending though the upper cladding layer, the active region and the lower cladding layer on both sides of the ridge to provide lateral injection of charge carriers into the active region of the laser.

20 Claims, 22 Drawing Sheets

OTHER PUBLICATIONS

Masahiro Asada, Atsushi Kamey Ama and Yasuharu Suematsu, Gain And Intervalence Band Absorption In Quantum-Well Lasers, IEEE Journal of Quantum Electronics, vol. QE–20, No. 7, Jul. 7, 1984, pp. 745–753.

Akira Furuya, Masao Makiuchi, Osamu Wada, Toshio Fujii and Hiroyuki Nobuhara, AlGaAs/GaAs Lateral Current Injection (LCI)–MQW Laser Using Impurity–Induced Disordering, Japanese Journal of Applied Physics, vol. 20, No. 2, Feb. 1987, pp. L134–L135.

O. Wada, A. Furuya, and M. Makiuchi, Planar, Compitible OEIC's Based On Multiquantum Well Structures; IEEE Photonics Technology Letters, vol. 1, No. 1, Jan. 1989, pp. 16–18.

T. R. Chen, Katsuyuki Utaka, Yuhua Zhuang, Ya–Yun Liu, Amnon Yariv, A Vertical Monolithic Combination of An InGaAsP/InP Laser And A Heterojunction Bipolar Transistor, IEEE Journal of Quantum Electronics, vol. QE–23, No. 6, Jun. 1987, pp. 919–924.

SEMICONDUCTOR RIDGE WAVEGUIDE LASER WITH LATERAL CURRENT INJECTION

This invention was made with government support under Grant N00014-90-J-4006 awarded by the Department of the Navy. The Government has certain rights in the invention.

This application is a continuation of application Ser. No. 08/294,511, filed Aug. 23, 1994, now abandoned.

BACKGROUND OF THE INVENTION

1. Field of the Invention

This invention relates in general to semiconductor lasers and, more particularly, to semiconductor ridge waveguide lasers.

2. Description of Related Art

Early semiconductor lasers were fabricated from a single material, for example gallium arsenide (GaAs), which was appropriately doped to form a pn junction. When a forward current flows through the pn junction of a semiconductor laser device, stimulated emission occurs due to recombination of electron-hole pairs which causes coherent photons to be emitted. More particularly, coherent photons are emitted from a resonant cavity formed by polishing the ends of the semiconductor laser device.

In more modern heterostructure injection semiconductor lasers, the charge carriers are vertically injected through the barrier layers. Barrier materials are also used as a cladding layer to optically confine the stimulated emission occurring at the pn junction within the semiconductor. Unfortunately, in such vertical injections lasers the optimization of electrical properties compromises the optimization of optical properties and vice versa.

SUMMARY OF THE INVENTION

One advantage of the semiconductor laser of the present invention is flexibility in the independent optimization of optical and electrical properties.

Another advantage of this semiconductor laser is the ability to modulate and govern the laser operation by changing the properties of a very small portion of the total laser volume.

Yet another advantage of the semiconductor laser of the present invention is a relatively low threshold current.

Another advantage of this semiconductor laser is high differential efficiency.

Yet another advantage of this semiconductor laser is low dynamic resistance.

Still another advantage of this semiconductor laser is low capacitance.

Yet one more advantage of this semiconductor laser is an ability to fabricate this laser or arrays of such lasers on a semi-insulating substrate.

In accordance with one embodiment of the present invention, a semiconductor ridge waveguide laser is provided which includes a substrate and a lower cladding layer situated atop the substrate. An active layer is situated atop the lower cladding layer. An upper cladding layer is situated atop the active layer and includes a major surface. The upper cladding layer includes a central raised ridge section which extends above the major surface and which divides the major surface into first and second side surfaces. The laser further includes an n contact region extending into the upper cladding layer and the active region from the first side surface of the upper cladding layer. The laser also includes a p contact region extending into the upper cladding layer and the active region from the second side surface of the upper cladding layer. In this manner, electrical charge carriers are laterally injected into the active layer when the n contact region and the p contact region are forward biased.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION OF THE INVENTION

Figure 1A:
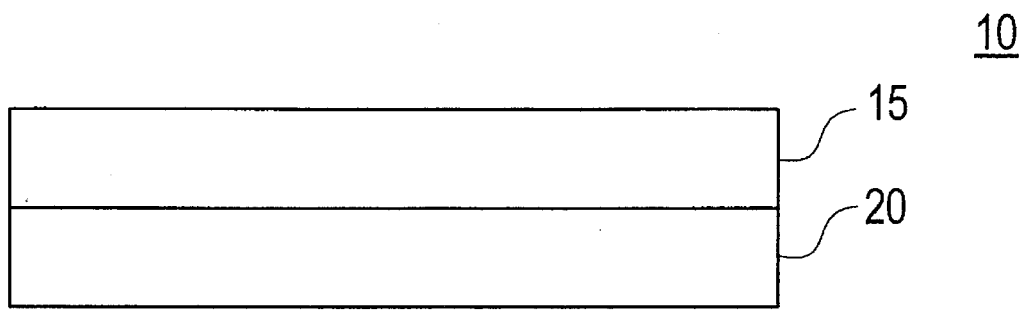
FIG. 1A is a cross sectional view of one embodiment of the semiconductor laser of the invention in an early stage of fabrication.
Figure 1B:
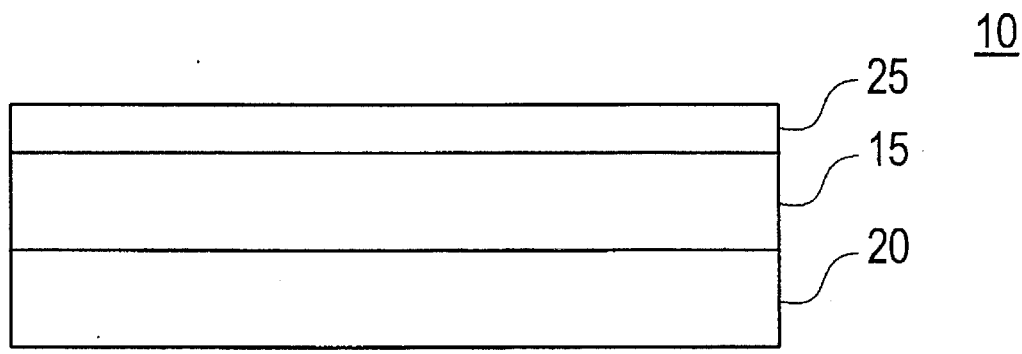
FIG. 1B is a cross sectional view of the semiconductor laser of FIG. 1A in a subsequent stage of fabrication.
Figure 1C:
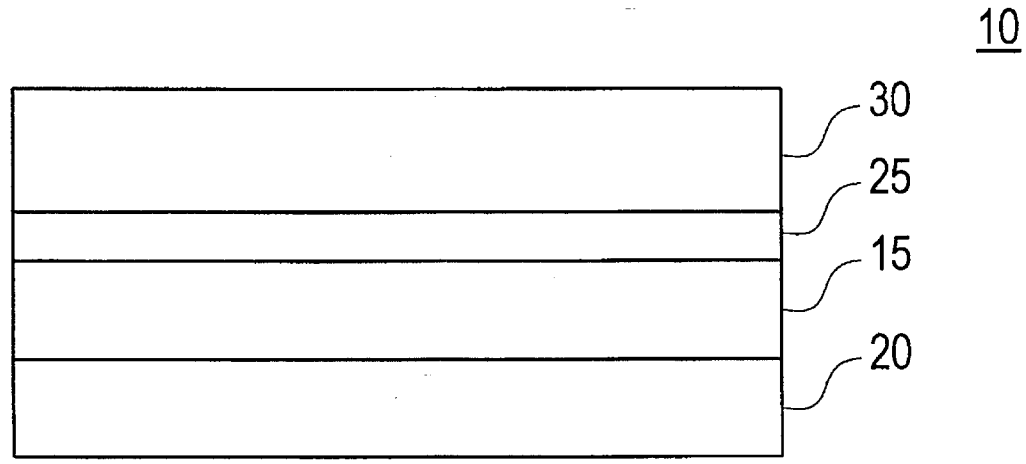
FIG. 1C is a cross sectional view of the semiconductor laser of FIG. 1B in a subsequent stage of fabrication.

FIG. 1A–1F illustrate steps in the fabrication of a semiconductor laser 10. As seen in FIG. 1A, a lower cladding layer 15 of intrinsic AlGaAs is epitaxially grown on an undoped AlGaAs semi-insulating substrate 20. A GaAs layer 25 is epitaxially grown on AlGaAs layer 15 to form the active region of the semiconductor laser as shown in FIG. 1B. An upper cladding layer 30 of intrinsic AlGaAs is epitaxially grown on active region/GaAs layer 25 as depicted in FIG. 1C.

Figure 1D:
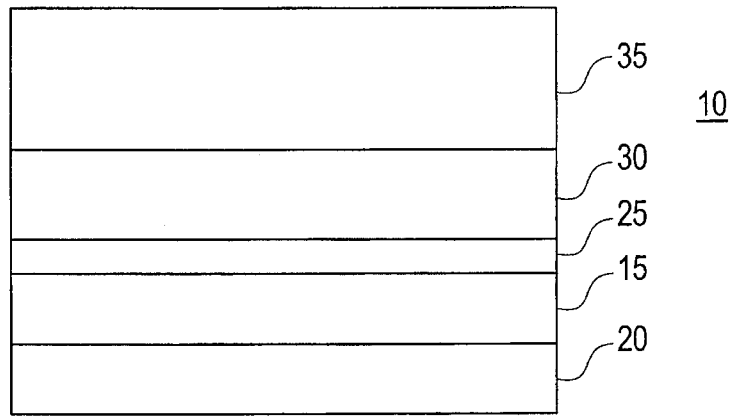
FIG. 1D is a cross sectional view of the semiconductor laser of FIG. 1C in a subsequent stage of fabrication.
Figure 1E:
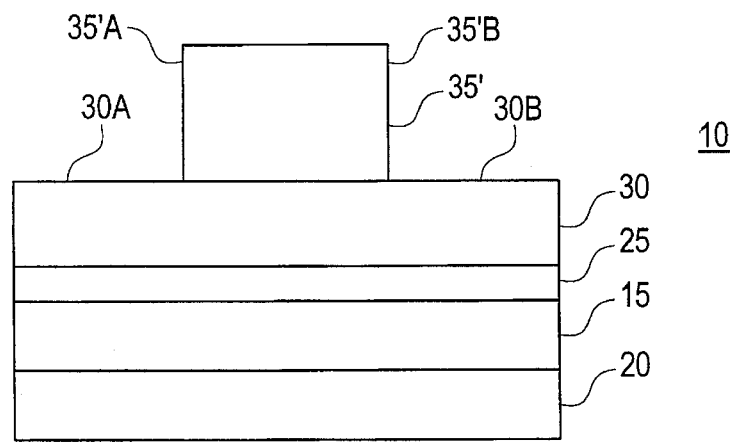
FIG. 1E is a cross sectional view of the semiconductor laser of FIG. 1D in a subsequent stage of fabrication.

A ridge layer 35 made of the same semiconductor material as upper cladding layer 30, namely intrinsic AlGaAs in this particular embodiment, is formed on top of upper cladding layer 30 by epitaxial growth or etching or other deposition technique, as seen in FIG. 1D. Ridge layer 35 is covered with a layer of photoresist (not shown) which is patterned such that the central region of upper cladding layer 35 is masked or covered. Laser 10 is then subjected to an etchant which etches away the opposed sides of ridge layer 35 to form a central ridge layer 35' as shown in FIG. 1E. A first upper cladding layer surface 30A and a second upper cladding layer surface 30B are thus exposed on either side of central ridge layer 35'. Central ridge layer 35' includes opposed side surfaces 35'A and 35'B. Central ridge layer 35' exhibits a generally parallelepiped geometry with a substantially rectangular cross section.

Figure 1F:
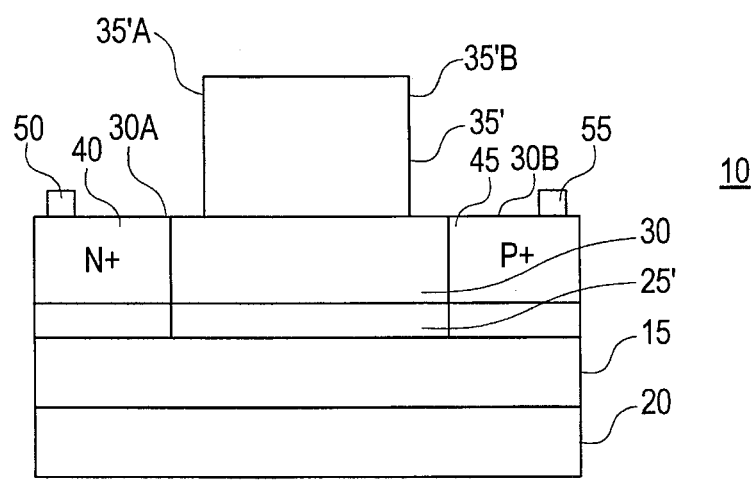
FIG. 1F is a cross sectional view of the semiconductor laser of FIG. 1E in a subsequent stage of fabrication.

First upper cladding layer surface 30A is subjected to n+ ion implantation or diffusion to form an n+ contact region 40 which extends through upper cladding layer 30 and active region/GaAs layer 25 as shown in FIG. 1F. Second upper cladding layer surface 30B is subjected to p+ ion implantation or diffusion to form a p+ contact region 45 which extends through upper cladding layer 30 and active region/GaAs layer 25. A confined active region 25' is thus formed which is bounded laterally by n+ contact region 40 and p+ contact region 45. Confined active region 25' is bounded vertically on the bottom by lower cladding layer 15 and on the top by upper cladding layer 30. The surface of n+ contact region 40 is metallized to form an electrical contact 50. The surface of p+ contact region 45 is metallized to form an electrical contact 55.

In one particular embodiment of the invention, substrate 20 exhibits a thickness of approximately 100–approximately 400 microns (μ) and lower cladding layer 15 exhibits a thickness of approximately 0.5–approximately 2.0 microns. Active region/GaAs layer 25 exhibits a thickness of approximately 40–approximately 400 Angstroms (A) and upper cladding layer 30 exhibits a thickness of approximately 0.1–0.4 microns. In this particular embodiment, central ridge layer 35' exhibits a thickness of approximately 1.5 microns. The above dimensions are given for example purposes. The actual dimensions used in a particular device can of course vary from those given.

Figure 2:
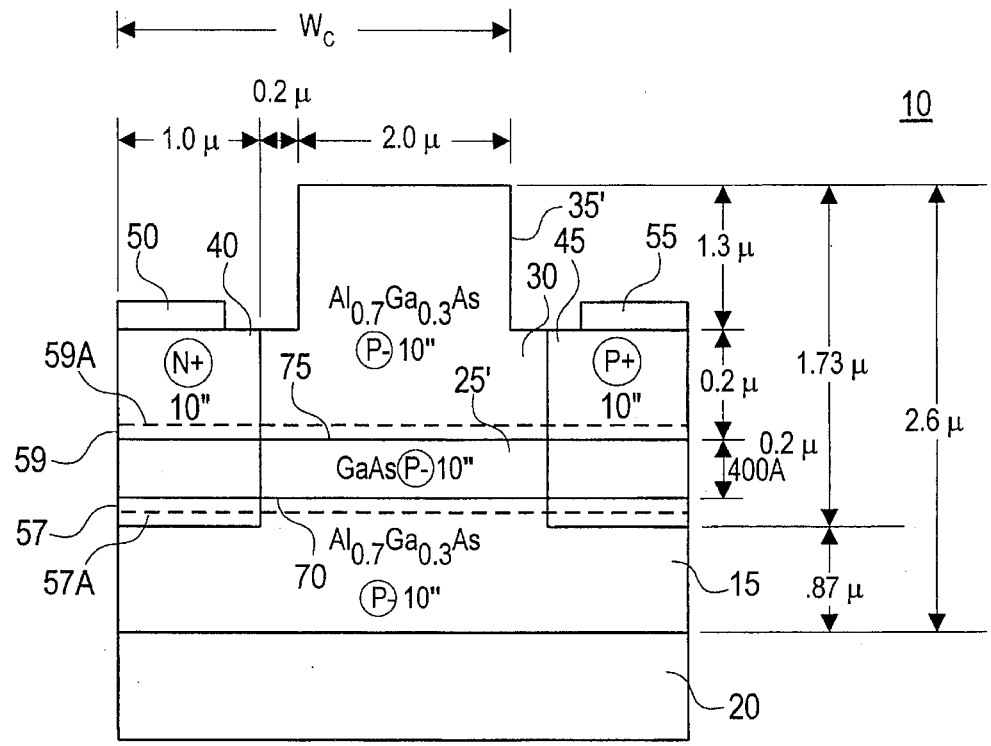
FIG. 2 is a cross sectional view of the semiconductor laser of FIG. 1F showing sample dimensions.

As shown in FIG. 2, semiconductor laser 10 optionally includes a graded layer 57 extending from heterojunction 70 downward to dashed line (boundary) 57A. The composition or bandgap of graded layer 57 is graded from GaAs at heterojunction 70 to $Al_xGa_{1-x}As$ at line or boundary 57A, where x is the molar fraction of aluminum. Semiconductor laser 10 also optionally includes a graded layer 59 extending from heterojunction 75 upward to dashed line (boundary) 59A. The composition or bandgap of graded layer 59 is graded from GaAs at heterojunction 75 to $Al_xGa_{1-x}As$ at line or boundary 59A. The thicknesses of optional graded layers 57 and 59 are is approximately 100 Å may vary generally from approximately 50 Å to approximately 600 Å, for example. These optional graded layers 57 and 59 perform the function of grading the refraction index and can be omitted if desired.

Figure 3:
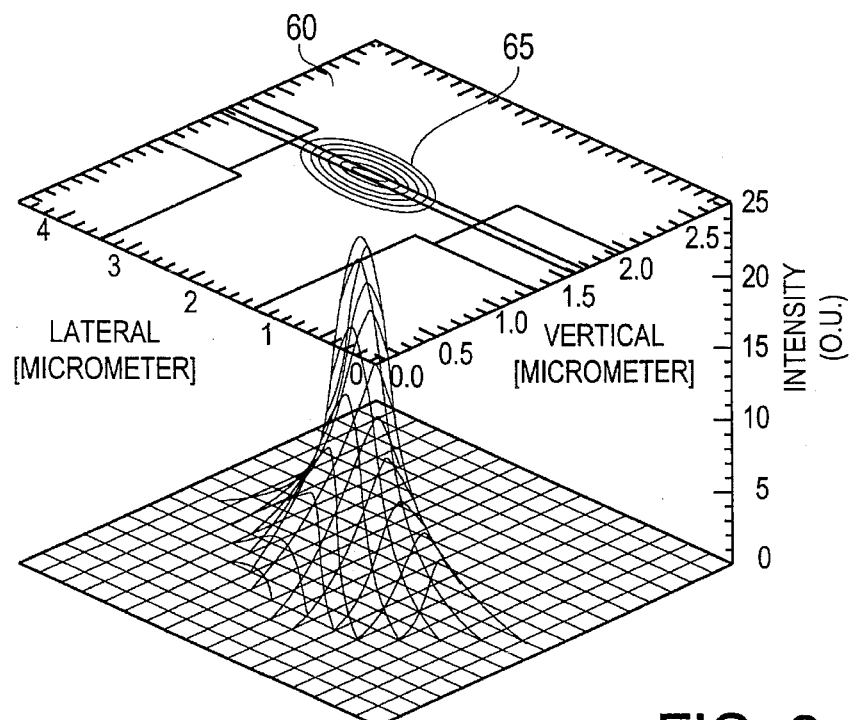
FIG. 3 is an intensity vs. position graph for the semiconductor laser of FIG. 2.

FIG. 3 is a 3 dimensional representation of the intensity of the laser optical field generated by laser 10 both in the vertical dimension and the lateral dimension. A cross sectional profile 60 of laser 10 is included in FIG. 3 to show the laser output relative to the surface features of laser 10. A cross sectional profile 65 of the laser output signal is also includes in FIG. 3. The unit of measurement of intensity shown on the vertical axis of FIG. 3 is a normalized arbitrary unit (ie. a.u.).

Figure 4:
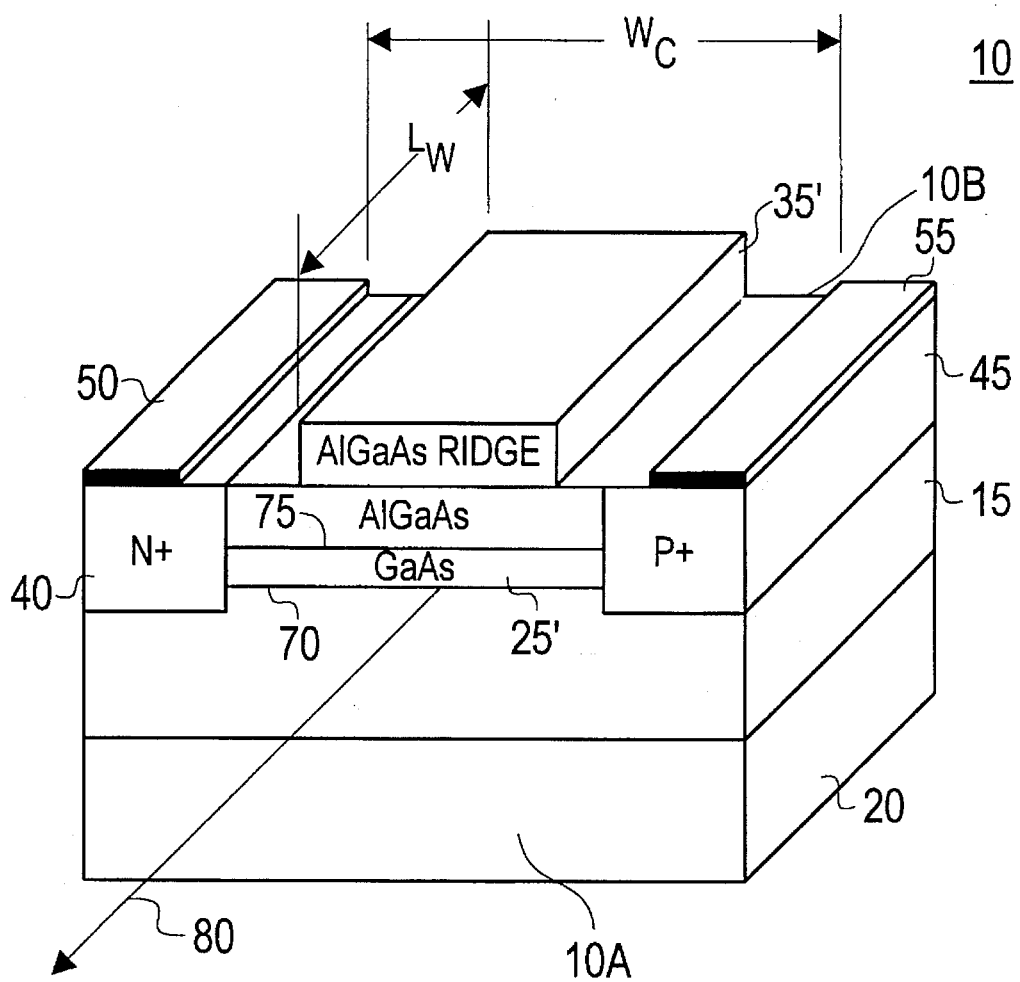
FIG. 4 is a perspective view of the semiconductor laser of FIG. 2.

FIG. 4 is a perspective view of laser 10 in which center ridge layer 35' is clearly seen. In FIG. 4, n+ contact region 40 and p+ contact region 45 are positioned laterally on the opposed sides of active region 25' Carriers are laterally injected into active region 25' by n+ contact region 40 and p+ contact region 45, respectively. More particularly, n+ contact region 40 injects electrons into active region 25' and p+ contact region 45 injects holes into active region 25'.

A three layer waveguide structure is thus formed atop intrinsic AlGaAs substrate 20. GaAs layer 25' is doped with p dopant at a concentration level of $10^{14}/cm^3$. The designation of layer 25' as "p–" in FIG. 2 indicates lightly doped p carriers. AlGaAs lower cladding layer 15 is unintentionally doped with p type at a typical concentration level of $10^{14}/cm^3$. A first heterojunction 70 is thus formed between GaAs active layer 25' and AlGaAs lower cladding layer 15 by the usage of different semiconductor materials on either side of heterojunction 70. AlGaAs upper cladding layer 30 is "unintentionally doped" with p type at a typical concentration level of $10^{14}/cm^3$. A second heterojunction 75 is thus formed between GaAs active layer 25' and AlGaAs upper cladding layer 30 by the usage of different semiconductor materials on either side of heterojunction 75.

Lower cladding layer 15 and upper cladding layer 30 form the bottom and top, respectively, of a waveguide in which the laser optical output signal is generated and vertically confined. The n+ contact region 40 and the p+ contact region 45 form the sides of the waveguide which laterally confine the laser output signal. In this particular embodiment, the length of the waveguide, $L_w$, is approximately 300 microns as shown in the perspective view of FIG. 4. Current is laterally injected into active region 25 through n+ contact region 40 and the p+ contact region 45. Central ridge layer 35', which is atop upper cladding layer 30, improves both the lateral and vertical optical confinement exhibited by semiconductor laser 10. This improved lateral confinement assists the laser in maintaining a single mode in the lateral direction and reduces absorption in n+ contact region 40 and p+ contact region 45. A laser output optical signal is generated in the direction indicated by arrow 80 in FIG. 4.

The spacing, $W_c$, between n+ contact region 40 and the p+ contact region 45 is selected to be approximately equal to the diffusion lengths of electrons and holes in active layer 25, namely between approximately 1 to approximately 5 microns. The spacing, $W_c$, is measured between the innermost side of n+ contact region 40 and the innermost side of p+ contact region 45 as shown in FIGS. 2 and 4. In this particular embodiment, the spacing, $W_c$, is approximately 2 microns. The n+ contact region 40 and the p+ contact region 45 exhibit doping concentrations of approximately $1.0 \times 10^{18}/cm^3$.

Semiconductor laser 10 includes opposed front and back surfaces 10A and 10B as shown in FIG. 4. More particularly, front and back surfaces 10A and 10B are facets which are crystal planes typically obtained by cleaving. Front and back surfaces 10A and 10B are alternatively referred as to front and back facets 10A and 10B. Semiconductor laser 10 includes cleaved facets wherein the reflectivity is given by ($r_{front}=r_{rear}=0.3$). Facets 10A and 10B are cleaved or coated facets.

Laser 10 is found to exhibit a zero bias capacitance of approximately 0.028 pF across contacts 50 and 55. The dynamic resistance of the laser is found to be less than approximately 2.3 ohms while lasing. The intrinsic channel formed in laser 10 at GaAs layer 25' becomes highly conductive because the laterally injected charge carriers from contact regions 50 and 55 are concentrated in the low bandgap active layer 25' thus forming a low resistance channel therein. The threshold current necessary to operate laser 10 is found to be approximately 6 mA. A semi-insulating substrate made from a semi-insulating material such as undoped AlGaAs is employed as substrate 20. This promotes the compatibility of laser 10 with other integrated circuit structures.

Figure 5:
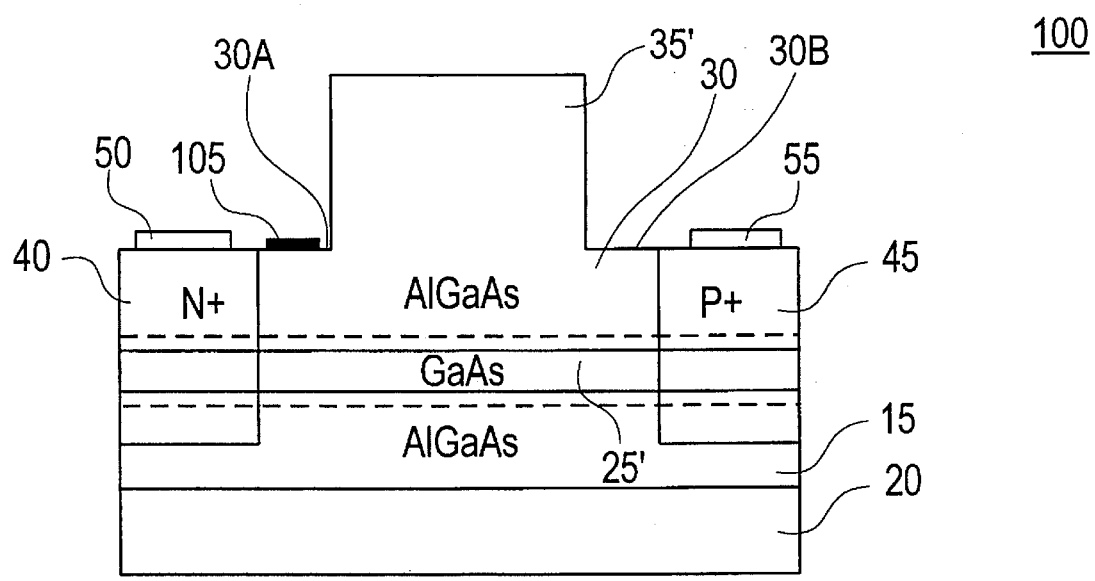
FIG. 5 is a cross sectional view of another embodiment of the semiconductor laser including a gate.

FIG. 5 shows a cross-sectional view of another embodiment of the semiconductor laser as semiconductor laser 100. Semiconductor laser 100 is similar to laser 10 of FIG. 2 except that a gate contact 105 is situated atop first upper cladding layer surface 30A between n+ contact region 40 and central ridge layer 35'. Gate contact 105 is oriented substantially parallel with respect to ridge layer 35'. By applying an appropriate voltage to gate contact 105, laser 10 can be switched on or off. For example to turn laser 100 on, a voltage of one polarity is applied to gate 105. However, to turn laser 100 off, a voltage of opposite polarity is applied thereto. A varying voltage signal can be applied to gate 105 to modulate the laser up to high frequencies extending well into the gigahertz range.

Figure 6:
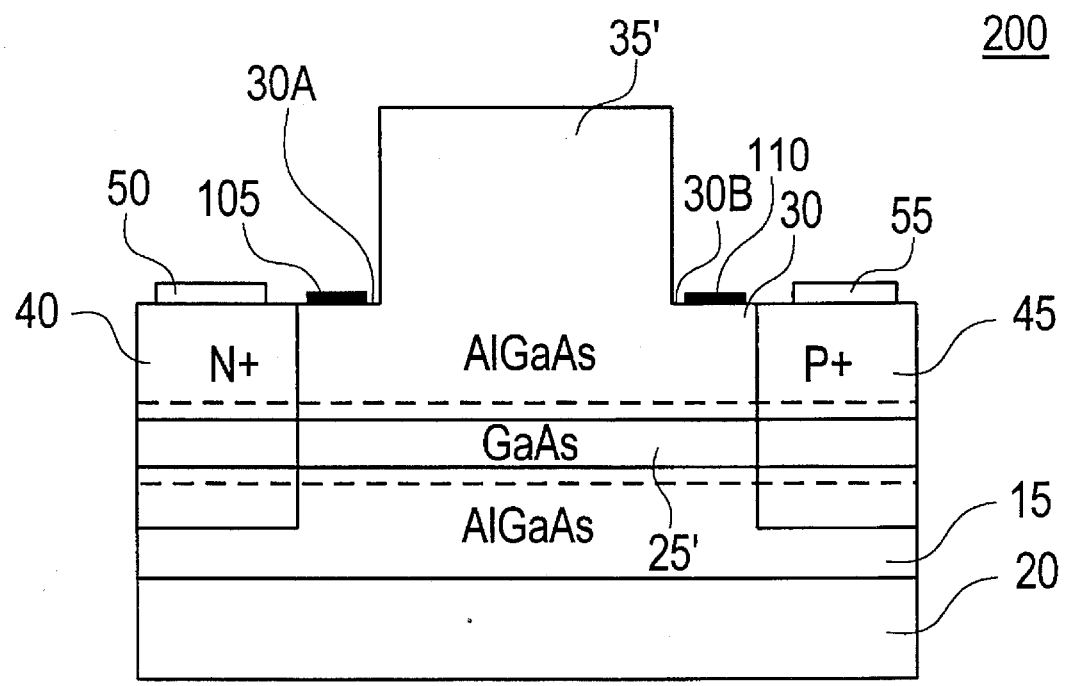
FIG. 6 is a cross sectional view of another embodiment of the semiconductor laser including two gates.

FIG. 6 shows a cross-sectional view of another embodiment of the semiconductor laser as laser 200. Semiconductor laser 200 is similar to laser 100 of FIG. 5 except that a gate contact 110 is situated atop first upper cladding layer surface 30B between p+ contact region 45 and central ridge layer 35'. Laser 200 thus includes two gate contacts, namely gate contacts 105 and 110. An appropriate signal can be applied to either gate contact 105 or gate contact 110 to switch laser 200 on or off in a manner similar to that discussed above with respect to laser 100. Laser 200 provides an electronic-optoelectronic OR function since laser 200 is off when either of the two gates is low. Laser 200 is on when both gates are high.

Figure 7A:
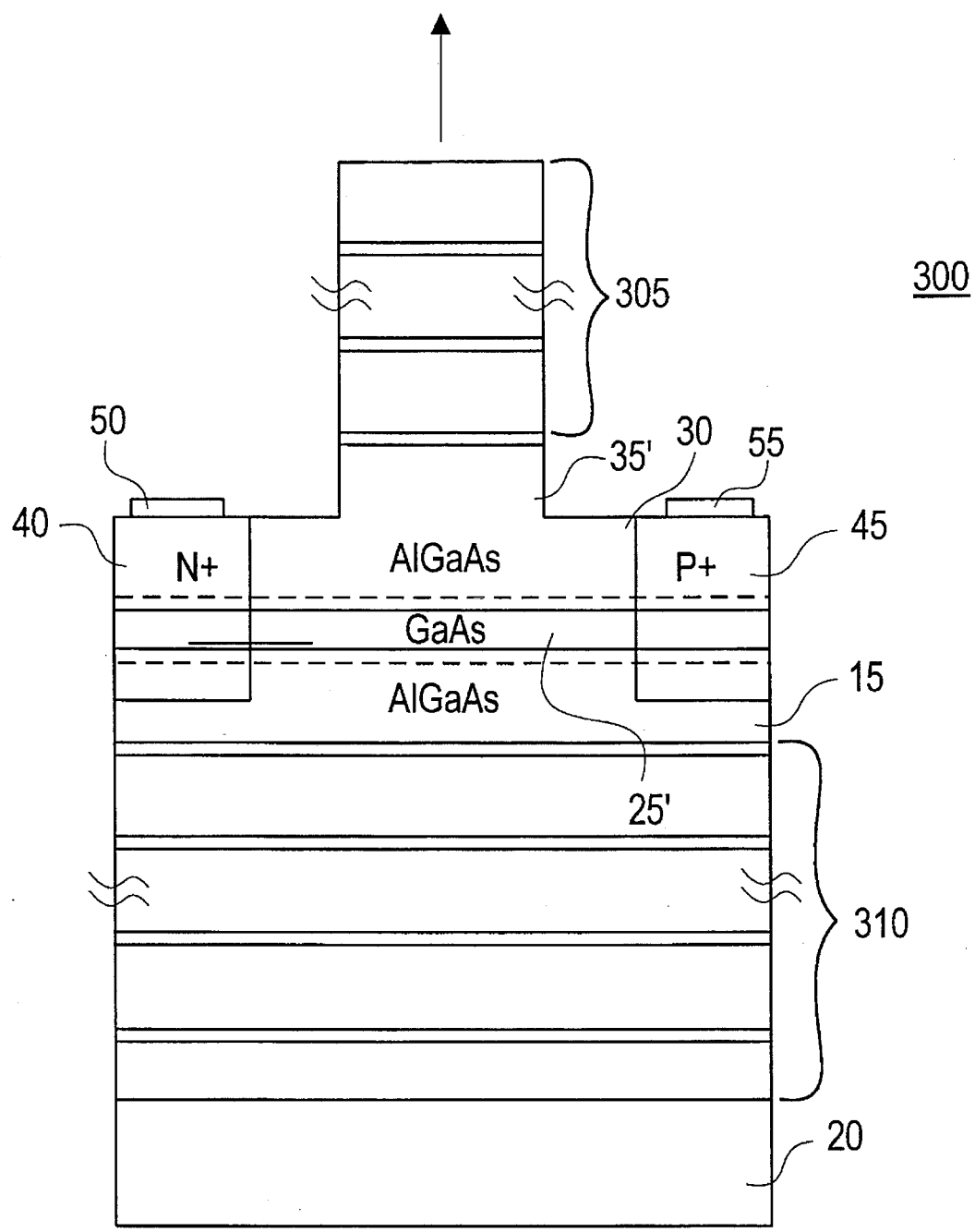
FIG. 7A is a cross sectional view of another embodiment of the semiconductor laser including Bragg reflectors.

FIG. 7A shows a cross-sectional view of another embodiment of the semiconductor laser as laser 300. Laser 300 is similar to laser 10 of FIG. 2 except that Bragg reflectors are situated on central ridge layer 35' and below lower cladding layer 15, respectively. In more detail, a Bragg reflector 305 is situated atop central ridge layer 35' as seen in FIG. 7A. Bragg reflector 305 is formed from a periodic arrangement of alternating high and low index layers. Another Bragg reflector 310 is situated between substrate 20 and lower cladding layer 15. Laser 300 is a surface emitting device in that it emits a laser signal from its top or bottom surface.

Figure 7B:
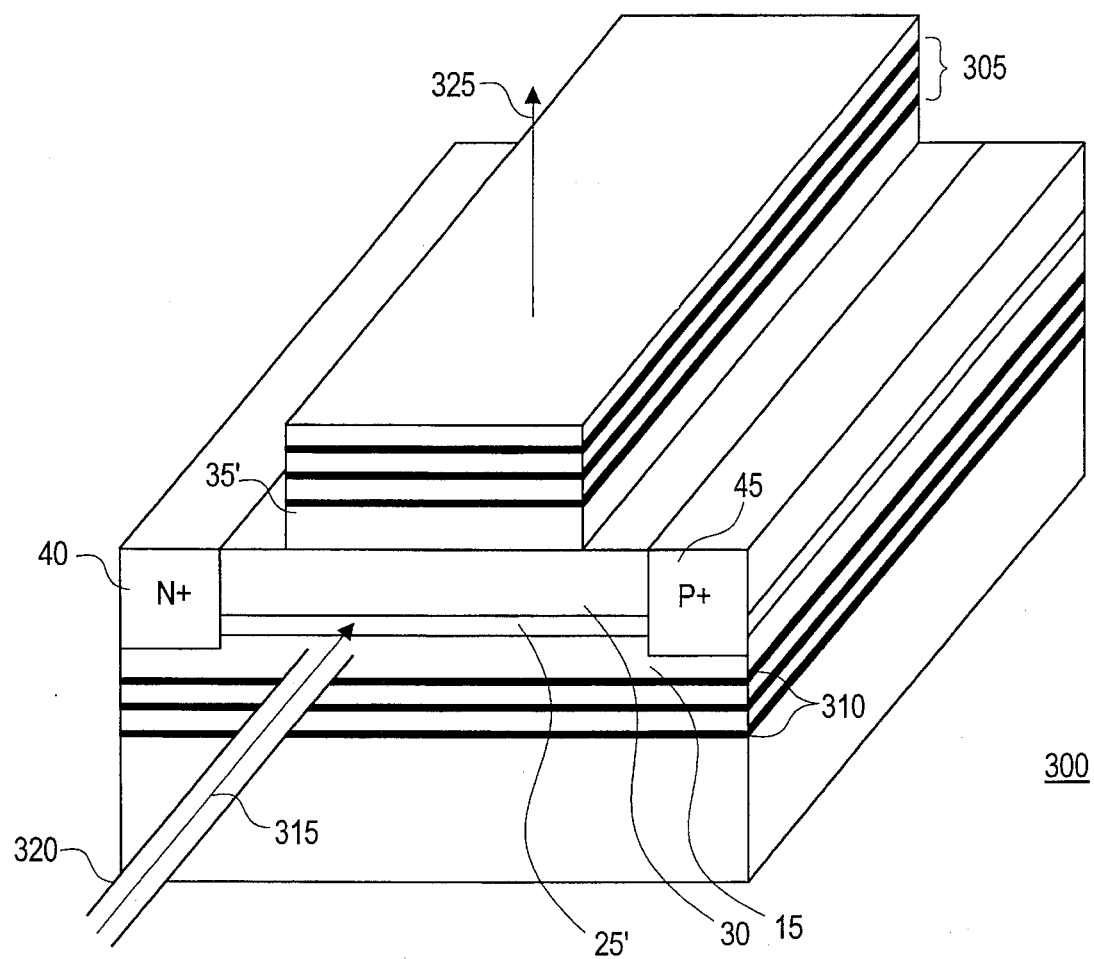
FIG. 7B is a perspective view of the semiconductor laser of FIG. 7A.

FIG. 7B is a perspective view of semiconductor laser 300 which is configured to operate as an optical mixer. Incident light indicated by arrow 315 is provided by optical fiber waveguide 320 to the vicinity of active region 25'. Light from optical fiber 320 mixes with the light radiation generated by laser 300. The resultant mixed optical output exits the top of Bragg reflector 305 as light output 325. For simplicity, windowed contact metallizations 50 and 55 which are situated atop contacts 40 and 50, respectively, are not shown in FIG. 7B.

Figure 8A:
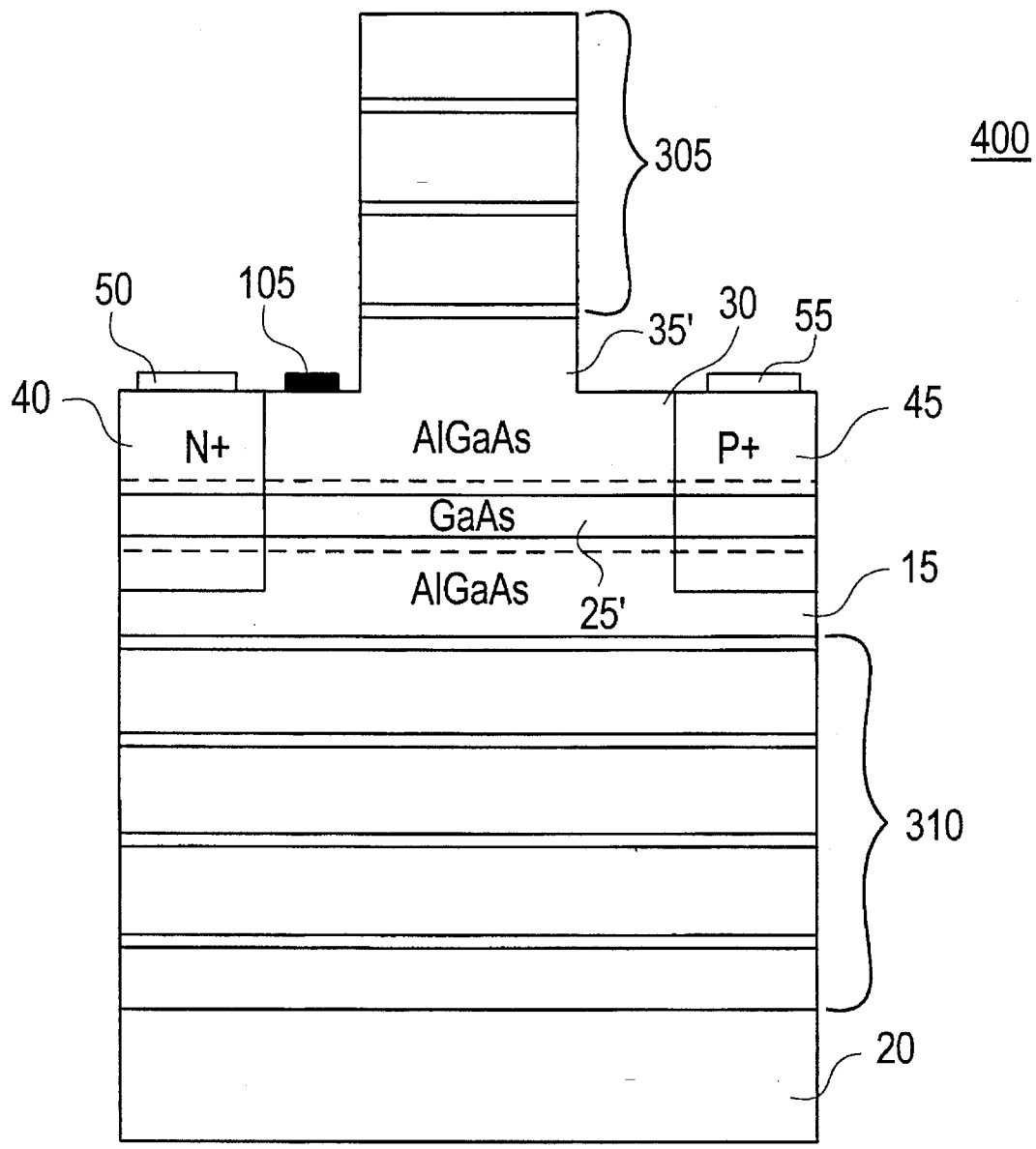
FIG. 8A is a cross sectional view of another embodiment of the semiconductor laser including Bragg reflectors and a gate.

FIG. 8A shows a cross-sectional view of another embodiment of the semiconductor laser as laser 400. Laser 400 is similar to laser 100 of FIG. 5 except that Bragg reflector 305 is situated atop upper cladding layer 30 and Bragg reflector 310 is sandwiched between substrate 20 and lower cladding layer 15. Laser 400 includes a gate contact 105 which can be used to switch the laser on and off or to modulate the light output of the laser.

Figure 8B:
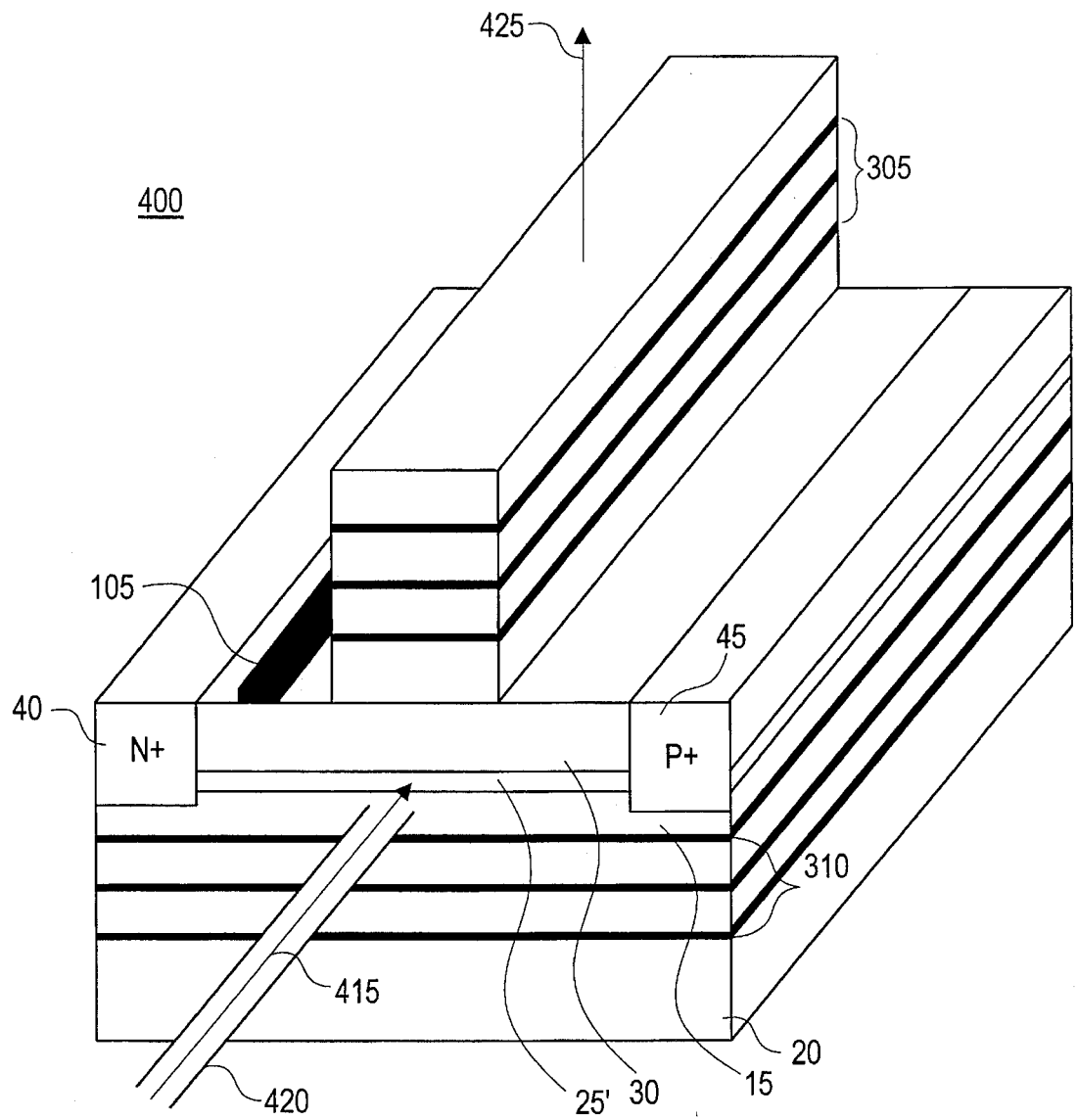
FIG. 8B is a perspective view of the semiconductor laser of FIG. 8A.

FIG. 8B is a perspective view of semiconductor laser 400 which is configured to operate as an optical mixer. Incident light indicated by arrow 415 is provided by optical fiber 420 to the vicinity of active region 25'. Light from fiber 420 mixes with the light radiation generated by laser 400. The resultant mixed optical output exits the top of Bragg reflector 305 as light output 425. For simplicity, contact metallizations 50 and 55 which are situated atop contacts 40 and 50, respectively, are not shown in FIG. 8B.

Figure 9A:
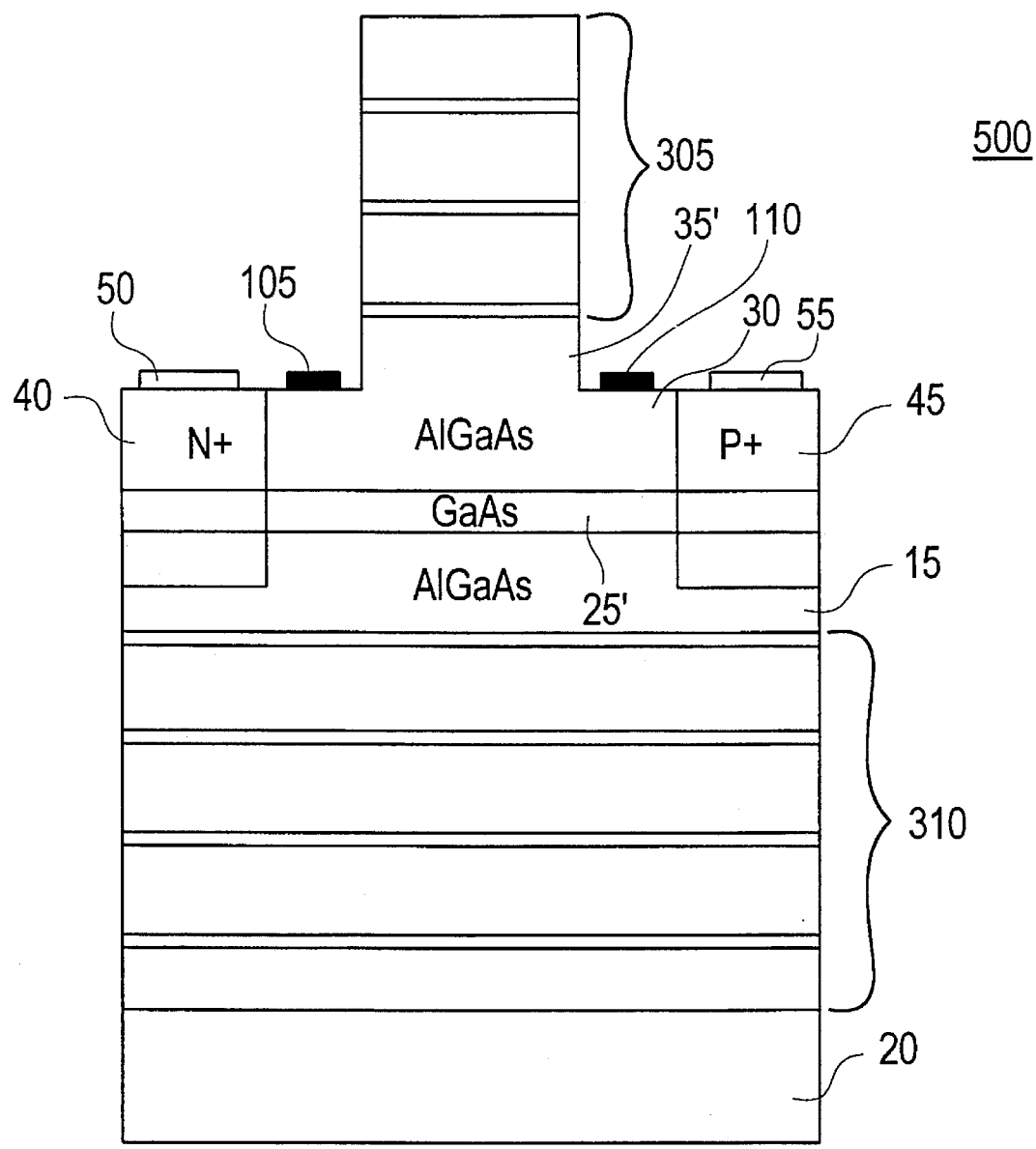
FIG. 9A is a cross sectional view of another embodiment of the semiconductor laser including Bragg reflectors and two gates.

FIG. 9A shows a cross-sectional view of another embodiment of the semiconductor laser as laser 500. Laser 400 is similar to laser 200 of FIG. 6 except that Bragg reflector 305 is situated atop upper cladding layer 30 and Bragg reflector 310 is sandwiched between substrate 20 and lower cladding layer 15. Laser 500 includes gate contacts 105 and 110 which can be used to switch the laser on and off or to modulate the light output of the laser. As explained earlier with reference to FIG. 6, this arrangement implements an electronic-optoelectronic OR function.

Figure 9B:
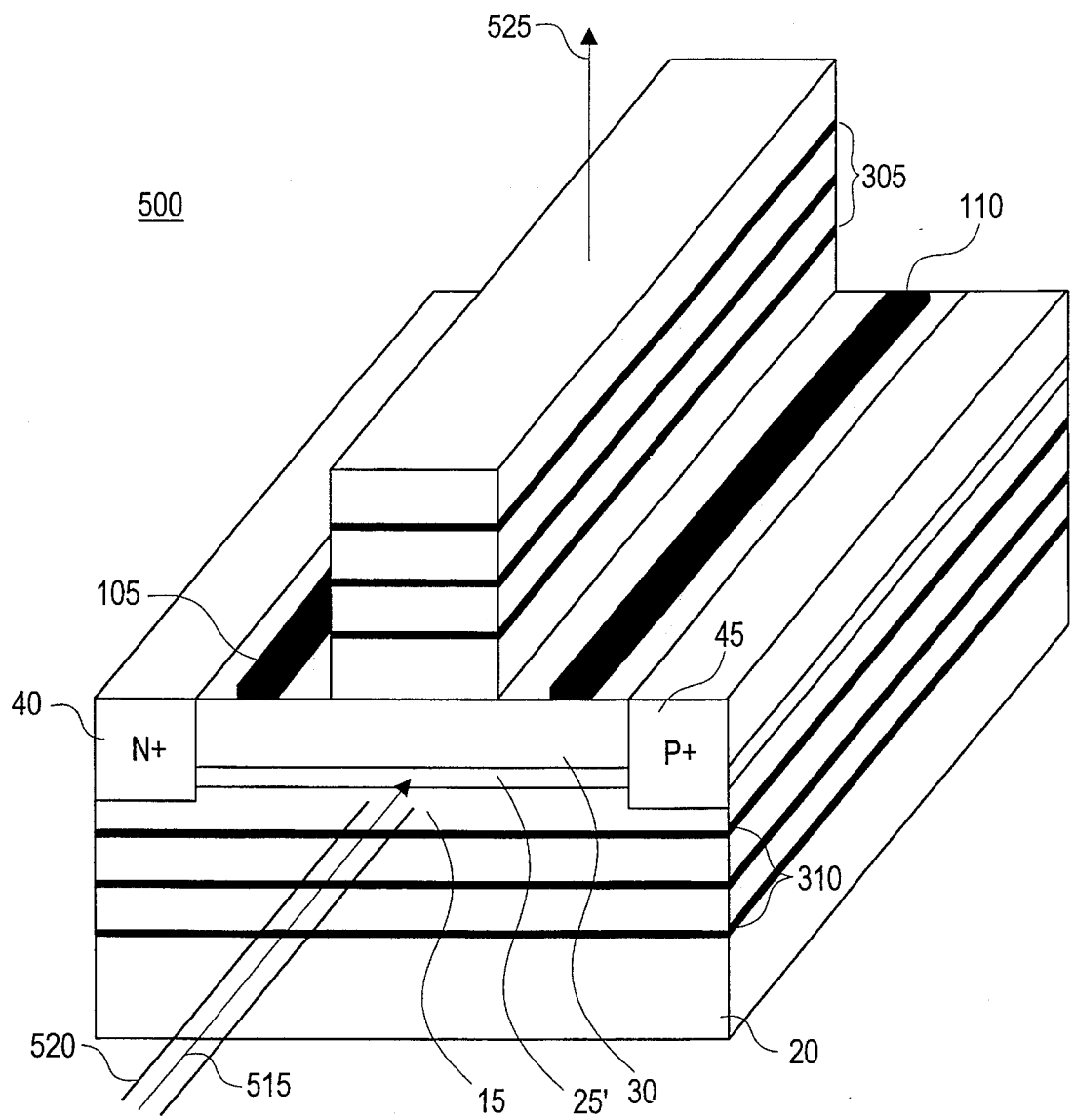
FIG. 9B is a perspective view of the semiconductor laser of FIG. 9A.

FIG. 9B is a perspective view of semiconductor laser 500 which is configured to operate as an optical mixer. Incident light indicated by arrow 515 is provided by optical fiber waveguide 520 to the vicinity of active region 25'. Light from optical fiber 520 mixes with the light radiation generated by laser 500. The resultant mixed optical output exits the top of Bragg reflector 305 as light output 525. For simplicity, contact metallizations 50 and 55 which are situated atop contacts 40 and 50, respectively,are not shown in FIG. 9B.

Figure 10:
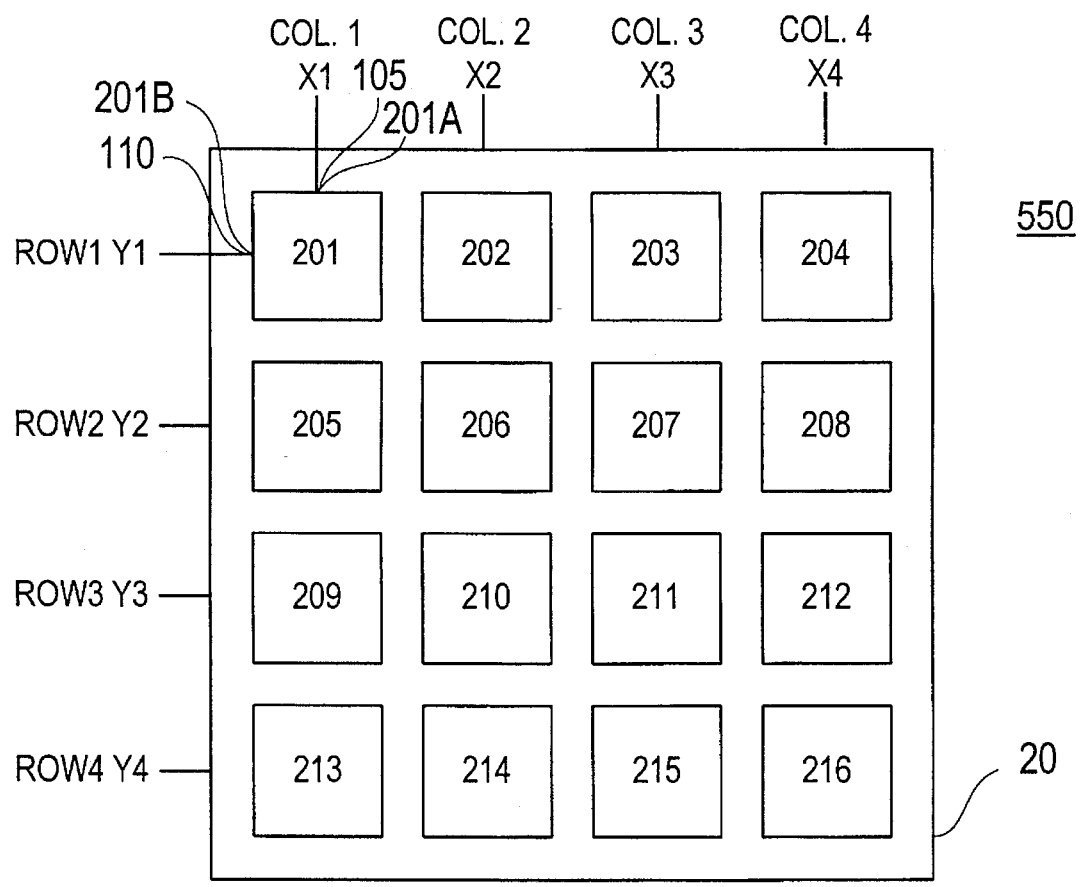
FIG. 10 is a representation of a laser array.

FIG. 10 is a laser array 550 which includes a plurality of lasers 201, 202 . . . 216 situated on a common substrate 20. Lasers 201–216 are of the laser 200 type shown in FIG. 6 or the laser 500 type shown in FIG. 9, for example. Lasers 201–216 are arranged in a 4×4 grid array which includes columns 1, 2, 3 and 4 and rows 1, 2, 3 and 4. Each of lasers 201–216 includes two input contacts in the same manner that laser 200 includes input gate contacts 105 and 110. For example, laser 201 includes a gate input 201A which corresponds to gate contact 105 and further includes a gate input 201B which corresponds to gate contact 110 of laser 200.

Laser array 550 includes column inputs x1, x2, x3 and x4. Laser array 550 further includes row inputs y1, y2, y3 and y4. The x1 input is coupled to the gate contact 105 of all lasers in column 1. The x2 input is coupled to the gate contact 105 of all lasers in column 2. The x3 input is coupled to the gate contact 105 of all lasers in column 3. The x4 input is coupled to the gate contact 105 of all lasers in column 4. The x1, x2, x3 and x4 inputs are alternatively referred to as the x1, x2, x3 and x4 data lines.

The y1 input is coupled to the gate contact 110 of all lasers in row 1. The y2 input is coupled to the gate contact 110 of all lasers in row 2. The y3 input is coupled to the gate contact 110 of all lasers in row 3. The y4 input is coupled to the gate contact 110 of all lasers in row 4. The y1, y2, y3 and y4 inputs are alternatively referred to as the y1, y2, y3 and y4 data lines. For simplicity, only laser 201 is shown as being coupled to data lines x1 and y1. It should be appreciated however that, in actual practice, all of lasers 201–216 are coupled to appropriate data lines in the manner described. In this manner, each of lasers 201–216 is individually addressable.

Laser array 550 is fabricated by conventional photolithographic techniques. More specifically, each of lasers 200 is built up, layer upon layer, by epitaxial growth while the remaining areas of substrate 20 are covered by a mask. The contact regions 40 and 45 are ion implanted as described earlier. Contacts 50, 55, 105 and 110 are formed by metallizing the upper surface of laser 200 at the desired locations.

The above 4×4 array is given for purposes of example and should not be taken as limiting the size of the array to any particular dimension. Both large and smaller array sizes are readily obtained using the structures and techniques described herein. Large laser arrays fabricated in the described manner can be used for display purposes such as alphanumeric displays and video/television type displays.

Figure 11:
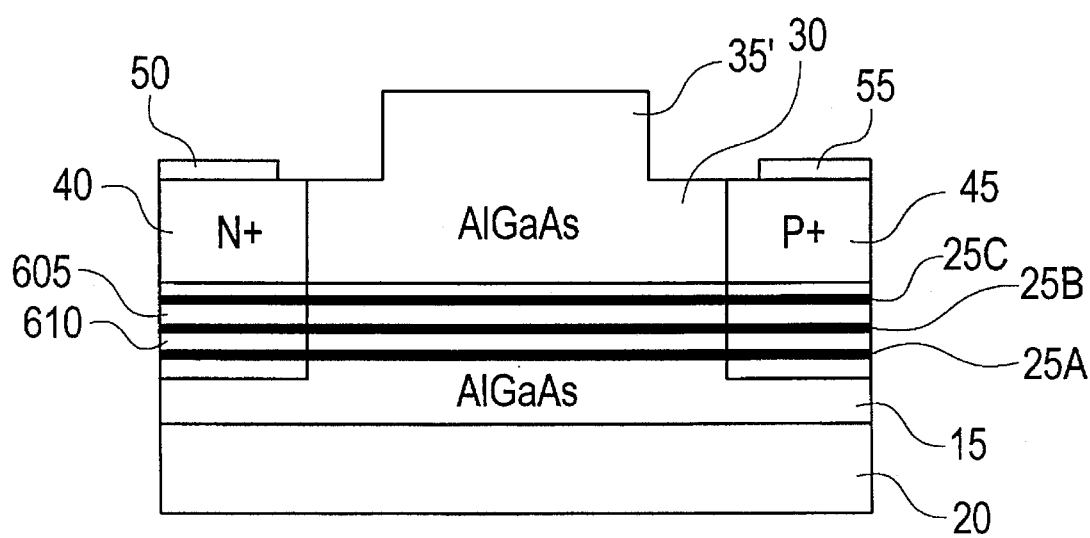
FIG. 11 is a cross sectional view of another embodiment of the semiconductor laser including multiple quantum wells.

FIG. 11 shows a cross sectional view of another embodiment of the semiconductor laser as laser 600. Laser 600 is similar to laser 10 of FIG. 2 except that rather than having a single active region 25' which corresponds to a single quantum well, laser 600 effectively includes multiple active regions which correspond to multiple quantum wells. In this particular embodiment, laser 600 includes three quantum wells formed by an active region which actually includes three active layers 25A, 25B and 25C. A respective quantum well is formed by each of active layers 25A, 25B and 25C. A quantum well is a relatively thin, narrow bandgap layer sandwiched between two wide bandgap barrier layers. The layers situated between active layers 25A, 25B and 25C are designated as barrier layers 605 and 610. Barrier layers 605 and 610 exhibit a wide bandgap. In this particular example, barrier layers 605 and 610 exhibit a thickness of approximately 100 Å.

Laser 600 operates at three different wavelengths depending on the input current level. In other words, depending in the amplitude of the input current passing between contact regions 40 and 50, a different one of the three quantum wells of laser 600 is excited to produce a laser output signal. At a small input current level, the bottom quantum well of active layer 25A contributes to the stimulated emission. Stimulated emission in the low frequency range can result from this relatively low input current level. In this particular example, the bottom quantum well is the widest quantum well of the laser device. The more narrow quantum wells associated with active regions 25B and 25C atop the lowest quantum well do not contribute to radiation loss because they are transparent for this radiation.

At a higher input current excitation level, the middle (more narrow) quantum well associated with active layer 25B is excited and the stimulated emission occurs at a higher frequency. This level of excitation is sufficient to overcome losses introduced by the bottom well associated with active layer 25A.

At a still higher input current excitation level, stimulated emission occurs at a frequency determined by the top quantum well associated with active region 25C. The stimulated emission now occurs at a higher frequency than before. In the multiple quantum well structure of laser 600, the frequencies of stimulated emission are determined by the material system and by the widths of the quantum wells and the laser cavity loss at the particular frequency.

For each of the active layers 25A, 25B and 25C, the material composition of such layers can be varied so that it gives rise to a different output frequency for each layer. When a material such as InGaAs is used for active layers 25A, 25B and 25C, the percentage of In, Ga and As can be selected to achieve a predetermined output frequency for each layer. For example, when active layer 25A is approximately 60Å thick, if $In_{0.2}Ga_{0.8}As$ is used for active layer 25A, then the wavelength exhibited by the laser signal output from active layer 25A is 980 nm. If active layer 25A is approximately 100 Å thick and GaAS (ie. no Indium), is used as active layer 25B, then the laser output signal of layer 25B exhibits a wavelength of 840 nm. Other wavelength output values may be selected as desired, according to the particular active layer composition selected. The thickness of active layers 25A, 25B and 25C are each selected to be within the range of approximately 10 Å to approximately 200 Å.

Figure 12:
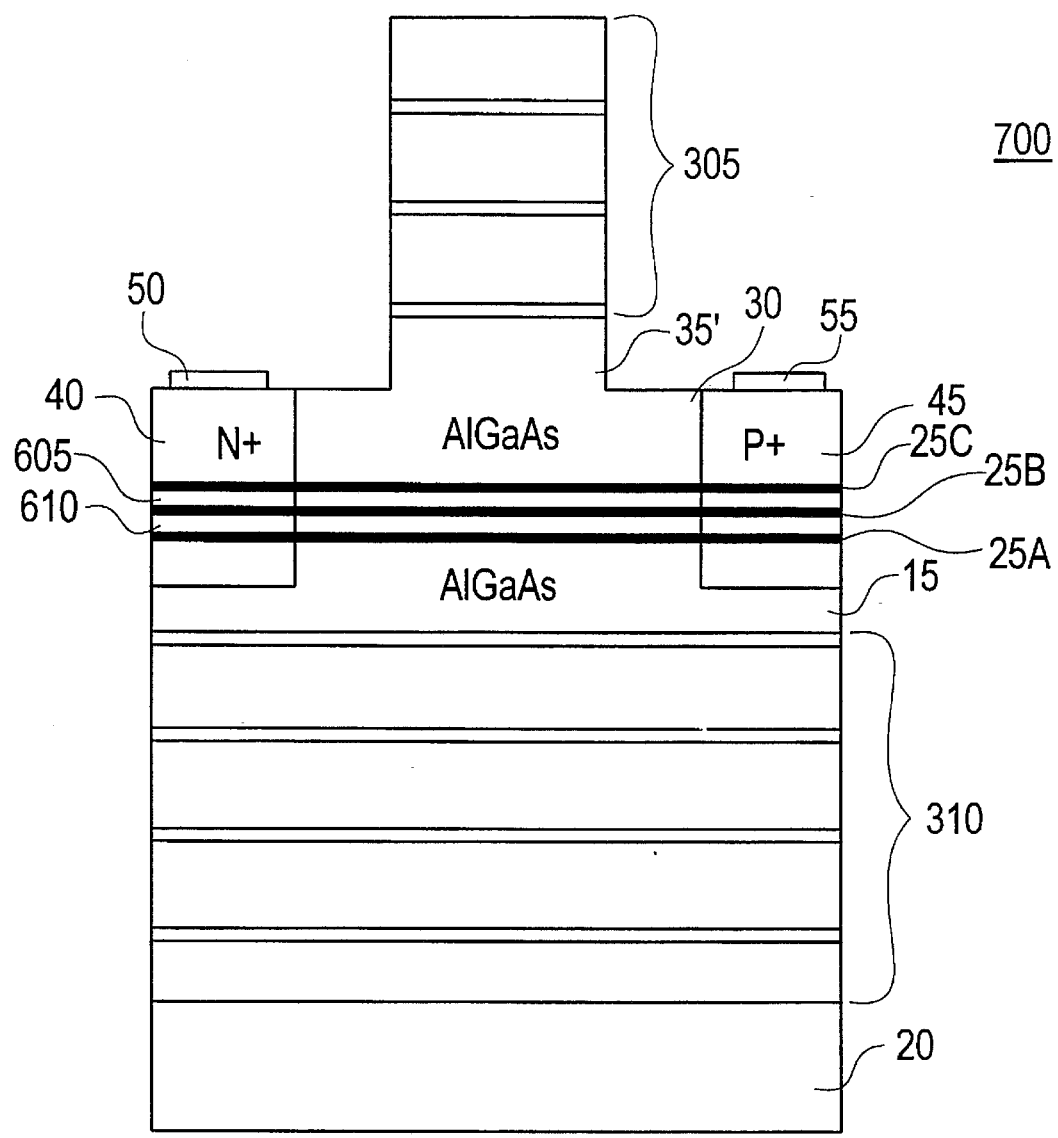
FIG. 12 is a cross sectional view of another embodiment of the semiconductor laser including multiple quantum wells and Bragg reflectors.

FIG. 12 shows a cross sectional view of another embodiment of the semiconductor laser as laser 700. Laser 700 is similar to laser 600 of FIG. 11 except that Bragg reflectors are situated on central ridge layer 35' and below lower cladding layer 15, respectively. More specifically, a Bragg reflector 305 is situated atop central ridge layer 35' as seen in FIG. 12. Another Bragg reflector 310 is sandwiched between substrate 20 and lower cladding layer 15.

Figure 13:
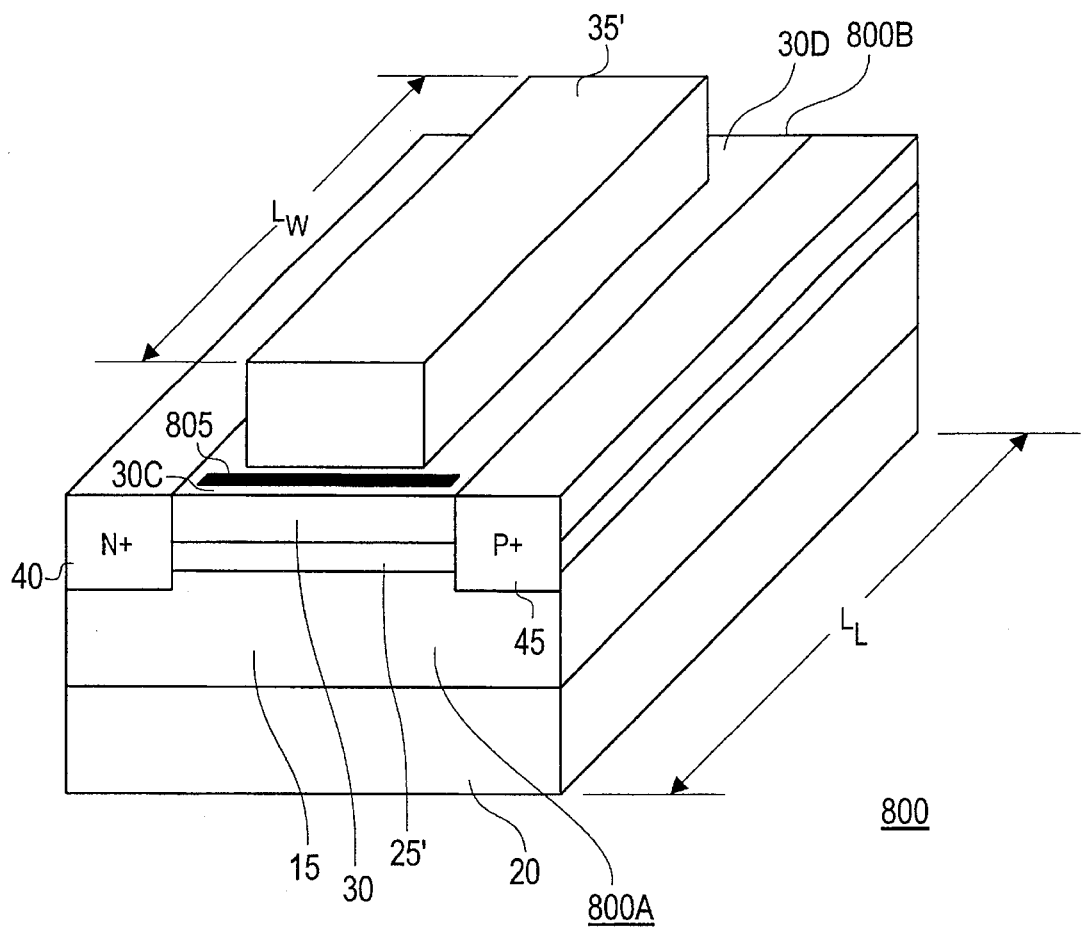
FIG. 13 is a perspective view of another embodiment of the semiconductor laser including a shortened central ridge layer.

FIG. 13 shows a perspective view of a laser 800 which is similar to laser 10 of FIGS. 2 and 4 except that in laser 800 the length, $L_W$, of central ridge layer 35' is less than that of the length, $L_L$. Laser 800 includes opposed end surfaces or facets 800A and 800B. Since central ridge layer 35' does not occupy the entire length, $L_L$, of laser 800, but rather is lengthwise or longitudinally centered atop upper cladding layer 30, open regions 30C and 30D are formed atop upper cladding layer 30. Open region 30C is formed between laser end 800A and central ridge layer 35'. Open region 30D is formed between laser end 800B and central ridge layer In one particular embodiment, the length, $L_L$, of laser device 800 is approximately 400 microns. The length $L_W$, of central ridge layer 35' is approximately 350 microns. Central ridge layer 35' is made shorter than the length of the laser cavity formed between laser end surfaces or facets 800A and 800B to make the end surfaces more lossy. This provides periodic feedback as the laser signal travels back and forth along the cavity in the active region. A high loss region 805 is situated in open region 30 to introduce additional loss. High loss region 805 is ion implanted into open region 20C. It is noted that the distance between ridge 35 and the front surface 800A of the laser device is equal to approximately 1 micron to approximately. 5 microns. By virtue of ridge 35 being absent in this region, increased loss is observed between ridge 35 and the front of the laser.

It is noted that the semiconductor lasers described herein are not limited to the specific dimensions set forth above. For example, laser 10 of FIGS. 2 and 4 may be modified into a detector apparatus by shortening the laser cavity length, $L_w$, down to approximately 1 micron. Since the laser length is shortened, the central ridge length is likewise shortened. This detector is capable of detecting when a laser optical signal is injected into active region 25' in a direction opposite to that of arrow 80 of FIG. 4. Shortening the laser in this manner results in a detector structure because the laser device absorbs incident light impinging in a direction opposite of arrow 80 within approximately 1 micron of the point of incidence. The detector produces a current between contact regions 40 and 45 which corresponds to incident optical pulses.

Figure 14:
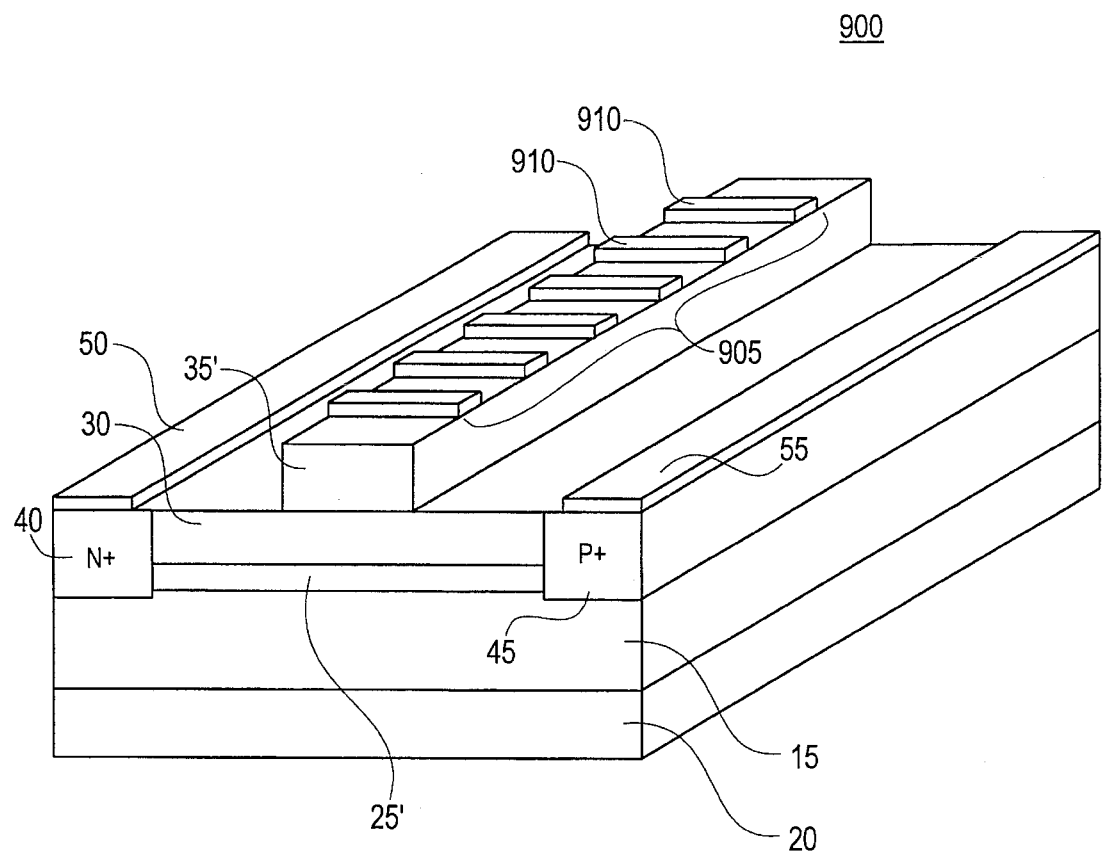
FIG. 14 is a perspective view of another embodiment of the semiconductor laser including a distributed feedback grating atop the central ridge layer.

FIG. 14 shows a perspective view of another embodiment of the semiconductor laser as laser 900. Laser 900 is similar to laser 10 of FIGS. 2 and 4 except that a distributed feedback grating 905 is situated atop central ridge layer 35'. Feedback grating 905 includes a plurality of spaced apart grating strips 910 which are located on the upper surface of central ridge layer 35' Grating strips 910 are formed from a grating material such as a metal, a semiconductor, or even an insulators. For example, such materials may be selected from the AlGaAs / GaAs system. To form distributed feedback grating, a layer of grating material is deposited on the upper surface of 35'. The layer of grating material is then covered with a layer of photoresist which is patterned where grating strips 910 are to be situated. The structure is then subjected to an etchant which etches away the grating material except for grating strips 910 which are shown in FIG. 14. Each grating strip 910 of distributed feedback grating 905 reflects a small portion of the optical signal back into the device to interfere with the optical signal itself.

Figure 15:
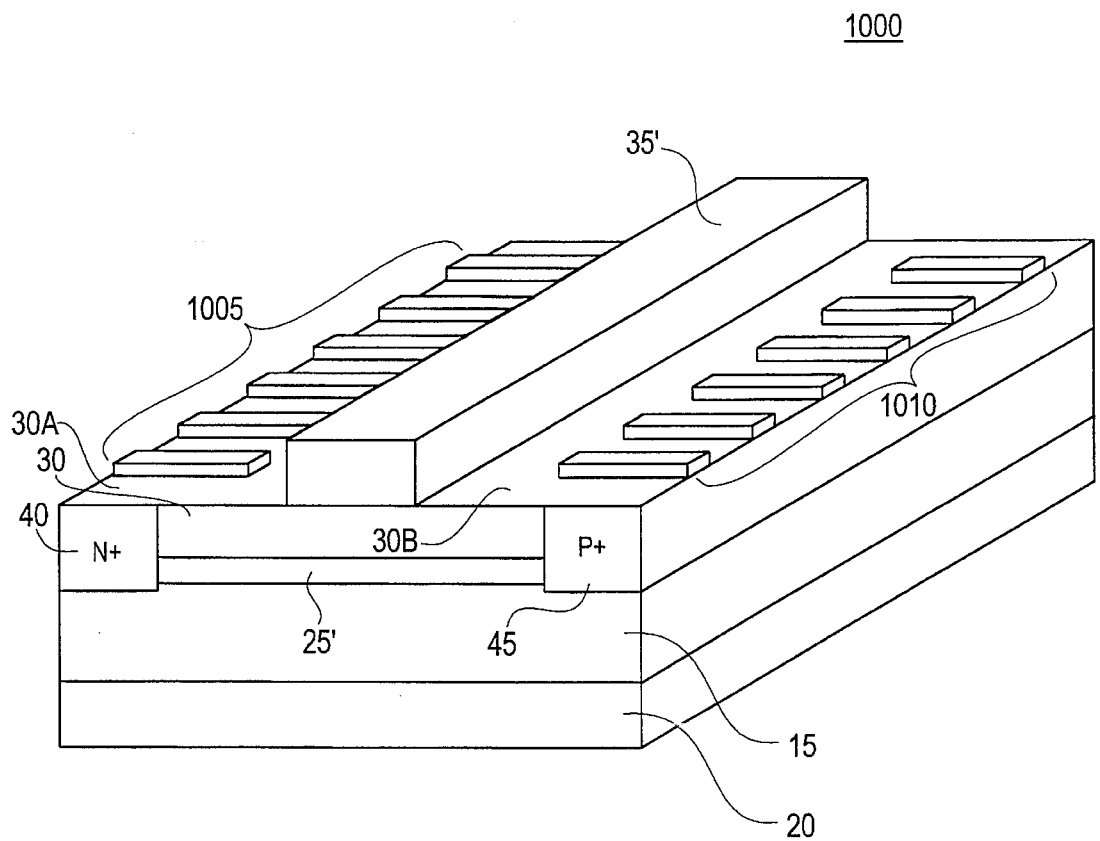
FIG. 15 is a perspective view of another embodiment of the semiconductor laser including two distributed feedback gratings atop the upper cladding layer.

FIG. 15 shows a perspective view of another embodiment of the semiconductor laser as laser 1000, Laser 1000 is similar to laser 10 of FIGS. 2 and 4 except that distributed feedback gratings 1005 and 1010 are situated atop upper cladding layer surfaces 30A and 30B, respectively. In laser 1000, gratings 1005 and 1010 are made of metallic material such that gratings 1000 and 1050 can double as electrical contacts for contact regions 40 and 45.

Figure 16:
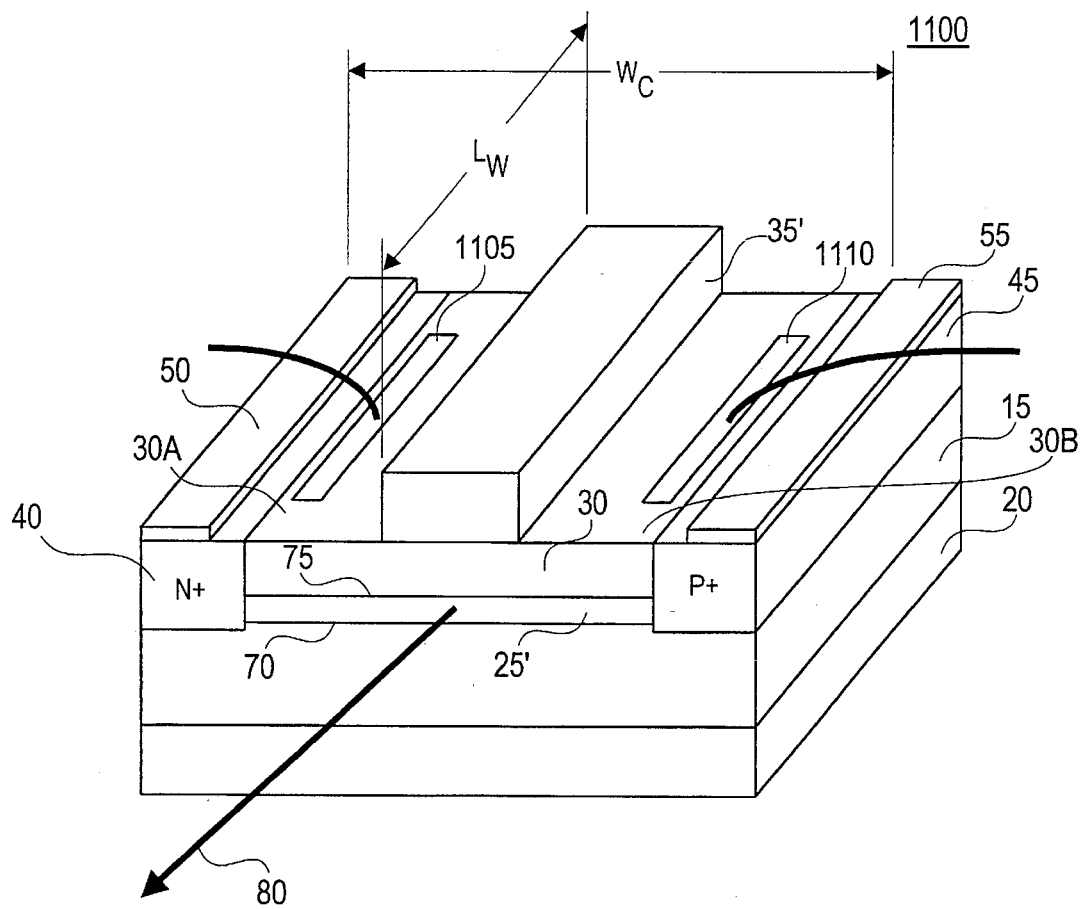
FIG. 16 is a perspective view of another embodiment of the semiconductor laser including two modulation contacts.

FIG. 16 shows another embodiment of the semiconductor laser as laser 1100. Laser 1100 is similar to laser 10 of FIG. 4 except that laser 1100 includes two modulation contacts 1105 and 1110 which are located in first upper cladding layer surface 30A and second upper cladding layer surface 30A, respectively. In one embodiment wherein modulation contacts 1105 and 1110 are Schottky contacts, the contacts are fabricated from materials such as tungsten and titanium for example. In another embodiment wherein modulation contacts 1105 and 1110 are ohmic contacts, the contacts are fabricated from materials such as gold, germanium or nickel for example. Modulation contacts 1105 and 1110 are ion-implanted into the surfaces 30A and 30B. Modulation contacts 1105 and 1110 permit high speed modulation of laser 1100. Modulation contacts 1105 and 1100 provide inputs for a high speed electrical modulating signal. Modulation contacts 1105 and 1110 advantageously permit the direct modulation of carrier injection into the active region.

Figure 17:
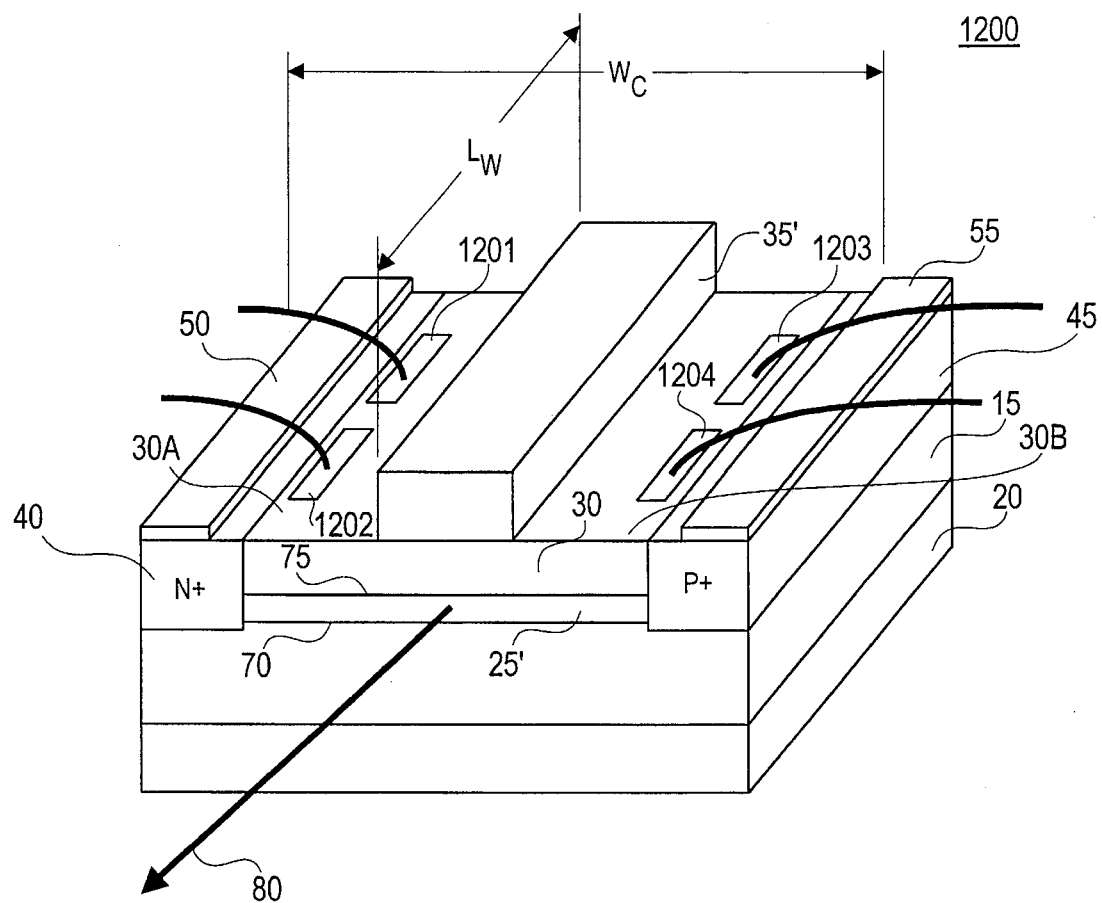
FIG. 17 is a perspective view of another embodiment of the semiconductor laser including four modulation contacts.

FIG. 17 shows another embodiment of the semiconductor conductor laser as laser 1200. Laser 1200 is similar to laser 1100 of FIG. 16 except that laser 1200 includes a series of modulation contacts which provide inputs for laser modulation. In this particular embodiment, four of such contacts 1201, 1202, 1203 and 1204 are provided on the upper cladding layer at surfaces 30A and 30B as shown in FIG. 17.

Figure 18:
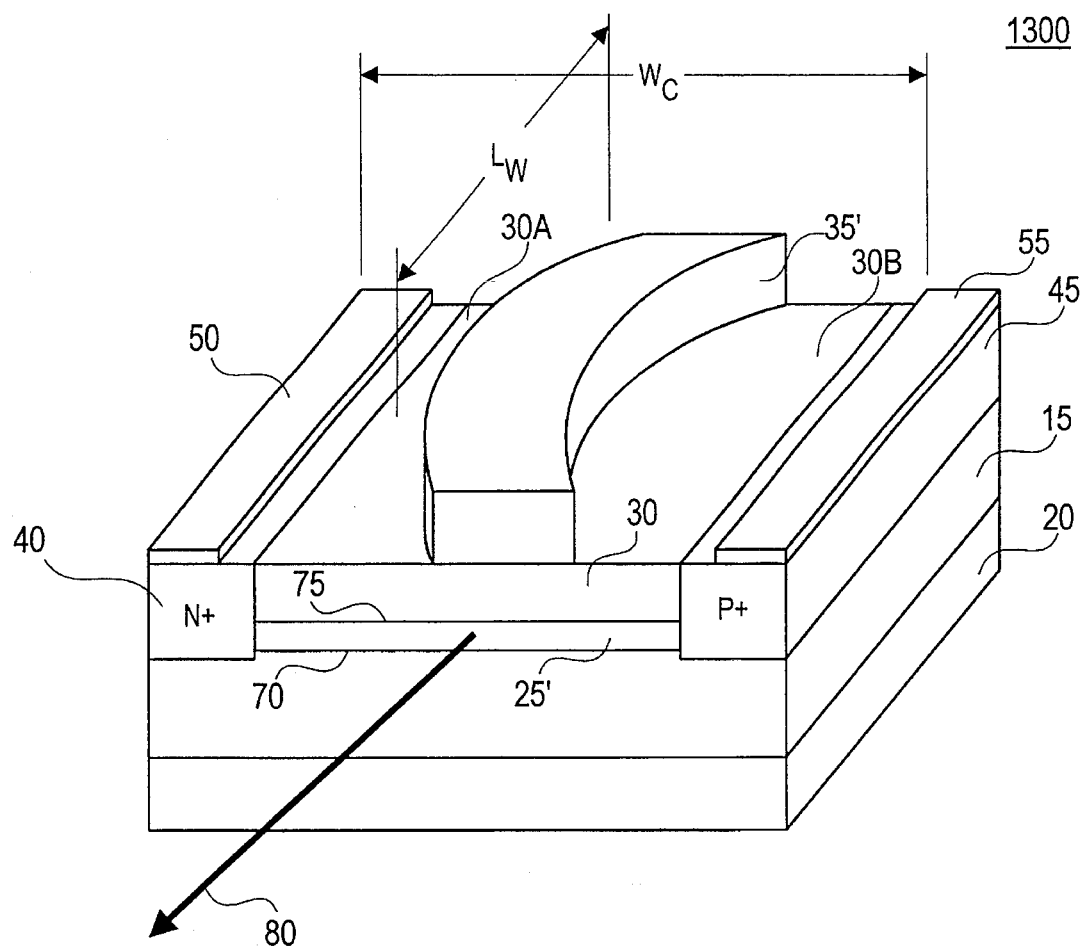
FIG. 18 is a perspective view of another embodiment of the semiconductor conductor laser including a ridge layer with a curved geometry.

FIG. 18 shows another embodiment of the semiconductor conductor laser as laser 1300. Laser 1300 is similar to laser 10 of FIG. 4, except that ridge layer 35' exhibits a curved geometry, namely a somewhat C-like shape. In contrast, laser 10 exhibits a parallelepiped geometry. In one particular embodiment, the curved ridge structure 35' exhibits a radius of approximately 1 mm and spans an arc of approximately 8 degrees to 20 degrees. The curved geometry of ridge layer advantageously provides high scattering loss to higher order later modes.

Figure 19:
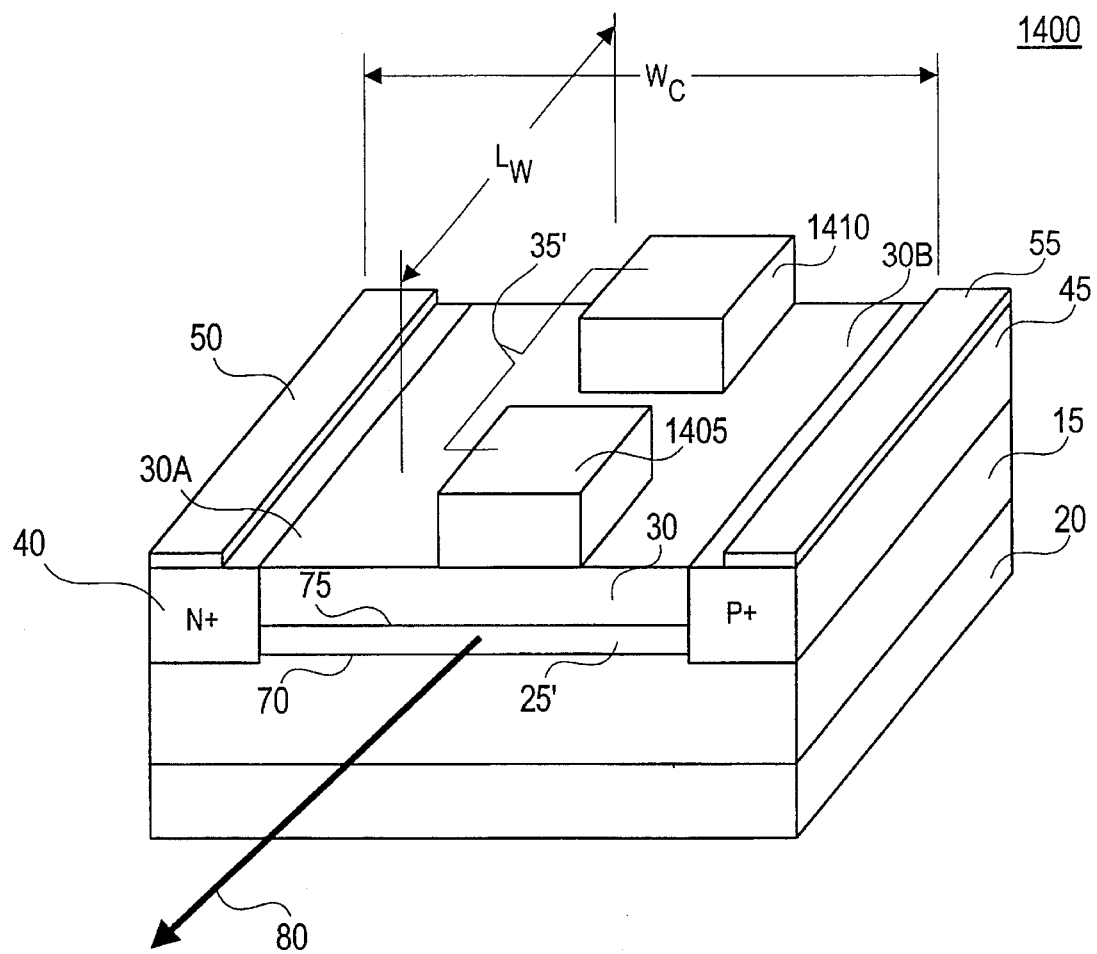
FIG. 19 is a perspective view of another embodiment of the semiconductor laser in which the ridge layer 35 is divided into a plurality of spaced apart sections.

FIG. 19 shows still another embodiment of the semiconductor laser as laser 1400. Laser 1400 is similar to laser 10 of FIG. 4 except that ridge layer 35 is divided into a plurality of spaced-apart sections such as 1405 and 1410. In one embodiment of laser 1400, spaced-apart sections 1405 and 1410 are situated approximately 1 micron to approximately 5 microns apart. Configuring laser 1400 in this manner desirably forms coupled lasers which can be used to generate relatively short laser pulses.

Although not specifically shown in drawings corresponding to all of the embodiments herein, it should be understood that the n+ contact region 40 and the p+ contact region 45 of these laser semiconductor devices extend from the upper surface of the device through the upper cladding layer, the active region and into the lower cladding layer. FIG. 2 depicts this contact arrangement which applies to the other semiconductor laser devices herein as well. In this manner lateral charge injection is achieved.

The foregoing has described a semiconductor laser which employs lateral charge injection and which is excitable by a relatively low threshold current. The disclosed semiconductor laser advantageously permits flexibility in the independent optimization of optical and electrical properties. This is so because the disclosed laser exhibits vertical optical confinement (via the upper and lower cladding layer and ridge structure) and also simultaneously exhibits lateral charge injection due to the position of the contacts on lateral sides of the active layer. The optical properties of the device are determined by the layers which control optical confinement, namely the upper and lower cladding layer and the ridge structure. The electrical properties of the device are principally controlled by the lateral current injection contact arrangement. In this manner, the optical properties of the device can be varied without significantly affecting the electrical properties of the device. The disclosed semiconductor also exhibits relatively high differential efficiency, low dynamic resistance and low input capacitance. The disclosed semiconductor laser is able to modulate and govern laser operation by changing the properties of a very small portion of the total laser volume.

While only certain preferred features of the invention have been shown by way of illustration, many modifications and changes will occur. For example, while an GaAs/AlGaAs system has been described herein to implement semiconductor laser 10, other systems such as InP/InGaAsP and AlN/GaN and the like may also be employed. It is, therefore, to be understood that the present claims are intended to cover all such modifications and changes which fall within the true spirit of the invention.

What is claimed is:

1. A semiconductor ridge waveguide laser comprising:

a substrate;

a lower cladding layer situated atop the substrate;

an active layer situated atop the lower cladding layer;

an upper cladding layer situated atop the active layer and including a major surface, the upper cladding layer including a central raised ridge section extending above the major surface and dividing the major surface into first and second side surfaces;

an n contact region extending into the upper cladding layer, the active region and the lower cladding layer from the first side surface of the upper cladding layer; and a p contact region extending into the upper cladding layer, the active region and the lower cladding layer from the second side surface of the upper cladding layer, such that electrical charge carriers are laterally injected into the active layer when the n contact region and the p contact region are forward biased.

2. The laser of claim 1 wherein the major surface of the upper cladding layer includes a first region between the n contact region and the ridge section, the major surface of the upper cladding layer further including a second region between the p contact region and the ridge section.

3. The laser of claim 2 further comprising a first gate contact situated at the first region.

4. The laser of claim 3 further comprising a second gate contact situated at the second region.

5. The laser of claim 1 further comprising a first Bragg reflector situated atop the ridge section and a second Bragg reflector situated sandwiched between the lower cladding layer and the substrate.

6. The laser of claim 5 wherein the major surface of the upper cladding layer includes a first region between the n contact region and the ridge section, the laser further comprising a first gate contact situated at the first region.

7. The laser of claim 6 further comprising a second gate contact situated at the second region.

8. The laser of claim 1 wherein each of the lower cladding layer, the active layer and the upper cladding layer include opposed common first and second ends, the common first end of the lower cladding layer, the active layer and the upper cladding layer forming a first facet and the common second end of the lower cladding layer, the active layer and the upper cladding layer forming a second facet, the laser including a laser cavity of predetermined length between the first and second facets, the ridge section exhibiting a length less than the length of the laser cavity such that a cladding layer portion is formed on the upper cladding layer between the ridge section.

9. The laser of claim 8 further comprising a high loss region situated in the cladding layer portion.

10. The laser of claim 1 further comprising a distributed feedback grating situated atop the ridge section.

11. The laser of claim 2 further comprising a first distributed feedback grating situated atop the first region and a second distributed feedback grating situated atop the second region.

12. The laser of claim 2 further comprising first and second modulation contacts situated in the first and second regions, respectively.

13. The laser of claim 2 further comprising a first plurality of modulation contacts in the first region and a second plurality of modulation contacts in the second region.

14. The laser of claim 1 wherein the ridge section exhibit a substantially parallelepiped geometry.

15. The laser of claim 1 wherein the ridge section exhibits a curved geometry.

16. The laser of claim 1 wherein the ridge section includes a plurality of spaced apart sections.

17. The laser of claim 6 wherein the first gate contact is situated substantially parallel with respect to the ridge section.

18. The laser of claim 7 wherein the second gate contact is situated substantially parallel with respect to the ridge section.

19. A semiconductor ridge waveguide laser comprising:

a substrate;

a lower cladding layer situated atop the substrate;

a plurality of active layers situated atop the lower cladding layer;

an upper cladding layer situated atop the plurality of active layers and including a major surface, the upper cladding layer including a central raised ridge section extending above the major surface and dividing the major surface into first and second side surfaces;

an n contact region extending into the upper cladding layer, the active region and the lower cladding layer from the first side surface of the upper cladding layer; and a p contact region extending into the upper cladding layer, the active region and the lower cladding layer from the second side surface of the upper cladding layer, such that electrical charge carriers are laterally injected into the active layer when the n contact region and the p contact region are forward biased.

20. The laser of claim further comprising a first Bragg reflector situated atop the ridge section and a second Bragg reflector situated sandwiched between the lower cladding layer and the substrate.

* * * * *

UNITED STATES PATENT AND TRADEMARK OFFICE
CERTIFICATE OF CORRECTION

PATENT NO. : 5,563,902
DATED : October 8, 1996
INVENTOR(S) : Xu, et al.

It is certified that error appears in the above-identified patent and that said Letters Patent is hereby corrected as shown below:

Col. 8, line 26, Delete "60AÅ" and insert --60Å--;

Col. 9, line 59-60, "Modulation contacts..." should begin a new paragraph.

Signed and Sealed this

Sixth Day of May, 1997

Attest:

BRUCE LEHMAN

*Attesting Officer*     *Commissioner of Patents and Trademarks*